(12) United States Patent
Uusitalo et al.

(10) Patent No.: US 12,544,009 B2
(45) Date of Patent: Feb. 10, 2026

(54) RING-SHAPED HOUSING ALIGNMENT FEATURES AND FABRICATION TECHNIQUES

(71) Applicant: Oura Health Oy, Oulu (FI)

(72) Inventors: Marko Uusitalo, Oulu (FI); Teemu Haverinen, Oulu (FI)

(73) Assignee: Oura Health Oy, Oulu (FI)

( * ) Notice: Subject to any disclaimer, the term of this patent is extended or adjusted under 35 U.S.C. 154(b) by 267 days.

(21) Appl. No.: 18/516,105

(22) Filed: Nov. 21, 2023

(65) Prior Publication Data

US 2025/0160746 A1    May 22, 2025

(51) Int. Cl.
*A61B 5/00*    (2006.01)

(52) U.S. Cl.
CPC ............ *A61B 5/681* (2013.01); *A61B 5/6826* (2013.01); *A61B 2562/0238* (2013.01); *A61B 2562/166* (2013.01)

(58) Field of Classification Search
CPC ............ A61B 5/681; A61B 2562/0238; A61B 2562/166
See application file for complete search history.

(56) References Cited

U.S. PATENT DOCUMENTS

2024/0324957 A1* 10/2024 Realubit ............ A61B 5/02427

* cited by examiner

*Primary Examiner* — Eugene T Wu
(74) *Attorney, Agent, or Firm* — Holland & Hart LLP

(57) ABSTRACT

Methods, systems, and devices for ring-shaped housing alignment features are described. The wearable ring device may include an inner shell and a printed circuit board. The inner shell may include a plurality of apertures, a first set of alignment features including planar regions that are formed into an arcuate ridge of the inner shell, and a second set of alignment features. The plurality of apertures may be aligned within the planar regions. The printed circuit board may include optoelectronic components and rigid regions. The rigid regions are configured to engage with the first set of alignment features to align the optoelectronic components in a first direction, and one or more features of the printed circuit board are configured to engage with the second set of alignment features to align the optoelectronic components in other directions such that the optoelectronic components are aligned with the plurality of apertures.

18 Claims, 6 Drawing Sheets

RING-SHAPED HOUSING ALIGNMENT FEATURES AND FABRICATION TECHNIQUES

FIELD OF TECHNOLOGY

The following relates to wearable devices and data processing, including ring-shaped housing alignment features and fabrication techniques.

BACKGROUND

Some wearable devices may be configured to collect data from users including temperature data, heart rate data, and the like. In some cases, the overall structure of the wearable device may affect the accuracy of data measurements performed by the wearable device. Additionally, wearable devices may be intended to be worn full-time, and may therefore be subject to constant wear and tear. As such, there is a desire to improve the durability of wearable devices, while also enabling the wearable devices to be manufactured in an efficient and cost-effective manner.

DETAILED DESCRIPTION

Figure 1:
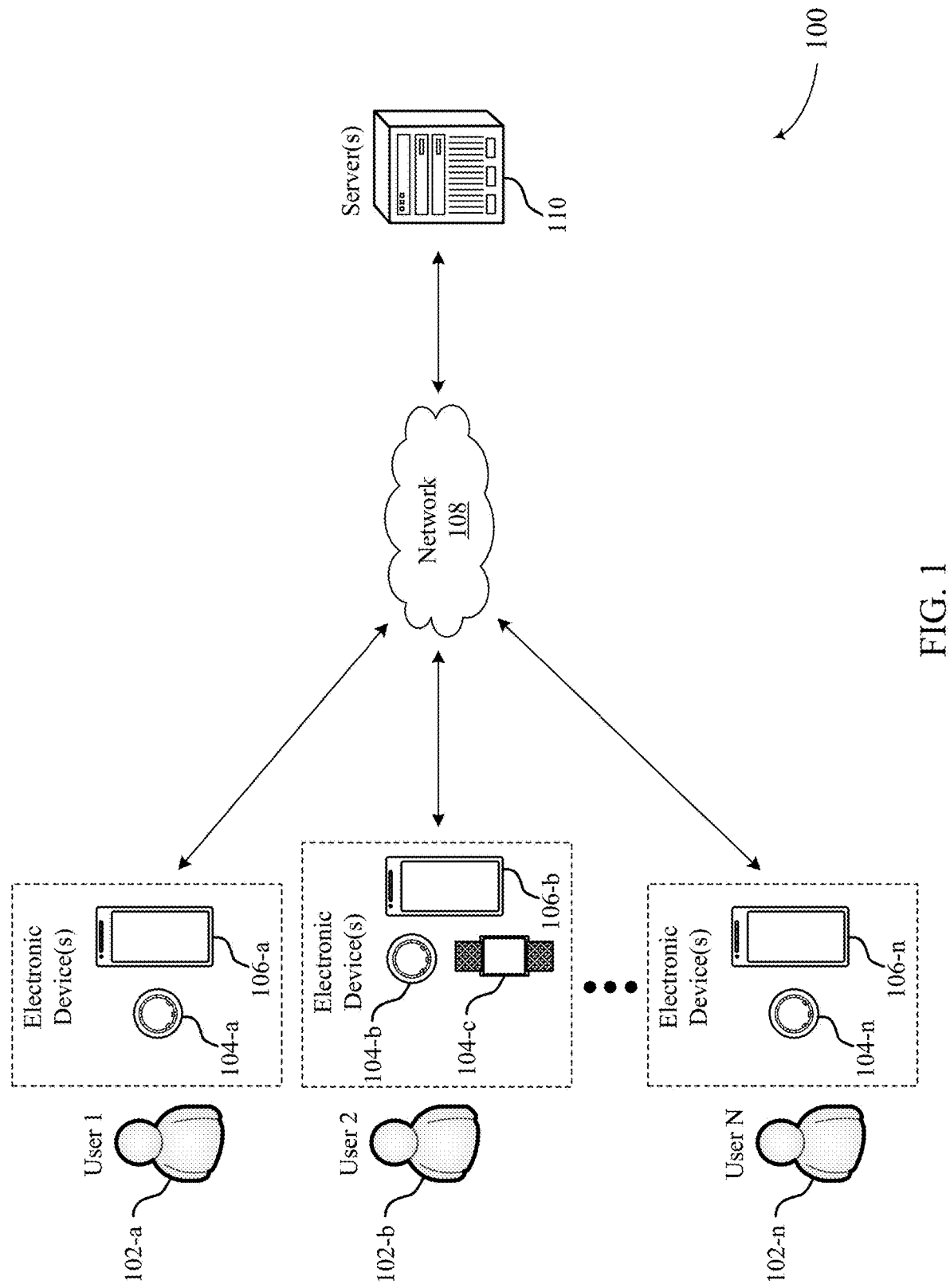
FIG. 1 illustrates an example of a system that supports ring-shaped housing alignment features and fabrication techniques in accordance with aspects of the present disclosure.

Some wearable devices may be configured to collect data from users associated with movement and other activities. For example, some wearable devices may be configured to continuously acquire physiological data associated with a user including temperature data, heart rate data, and the like. As such, some wearable devices may be configured to house one or more optical sensors configured to acquire physiological data from a user.

Wearable devices may include separate optoelectronic components (e.g., optical sensors) that are attached to the device structure to perform physiological measurements. The device structure may include a housing and apertures in the housing that allow light to pass into the tissue surface of the user. However, integration and assembly of the optoelectronic components into wearable structures with adequate accuracy and robustness may be challenging due to the size of the components and precision required for such optoelectronic components. In this regard, inaccurate placement of the optoelectronic components may result in unreliable physiological measurements.

Accordingly, aspects of the present disclosure are directed to methods for using alignment features positioned on a printed circuit board (PCB) and alignment features positioned on a housing (e.g., an inner shell) of a wearable device to align the optoelectronic components within the apertures of the inner shell. In particular, aspects of the present disclosure are directed to one or more alignment features of the inner shell such as an x-direction locator (e.g., a notch) on the inner circumference of the inner shell, y-direction locator edges on the inner circumference of the inner shell, and z-direction location surfaces (e.g., one or more planar surfaces) on the inner shell that enable proper placement of the PCB on the inner shell. In such cases, the alignment features may be an example of locator features, locator edges, location surfaces, or a combination thereof. Precisely and reliably placing the PCB onto the inner shell results in proper placement of the optoelectronic components that are mounted to the PCB with respect to the apertures in the inner shell.

In some cases, a wearable device may include a ring-shaped housing that includes the inner shell and an outer shell. The PCB that houses optoelectronic components of the device may be encased within the ring-shaped housing. In some cases, light emitting components and light receiving components (e.g., the optoelectronic components) may be disposed on a first surface of the PCB and may extend through one or more apertures in the inner shell such that the light emitting and light receiving components are substantially flush with an inner ring-shaped surface of the inner shell. By moving the light emitting and light receiving components up into the apertures of the inner shell, the PCB may be moved closer to the inner shell, thereby reducing the thickness of the wearable device. The PCB may engage with the alignment features within the inner shell in order to ensure that the PCB is oriented correctly within the inner shell, thereby aligning the optoelectronic components within the apertures. The PCB may include an x-direction locator (e.g., indent), y-direction locator edges, and rigid regions that correctly position the PCB within the inner shell.

A method of manufacturing may include engaging the alignment features of the PCB with the alignment features of the inner shell to align the optoelectronic components of the PCB over the apertures of the inner shell. The optoelectronic components may be disposed on the one or more rigid regions of the PCB. The inner shell may include one or more planar regions that the apertures are disposed within. The planar regions of the inner shell may help move the PCB closer to the inner shell. In such cases, the PCB may be positioned on the inner shell such that the rigid regions of the PCB are placed on the planar regions of the inner shell due to the alignment features engaging with each other. As a result, the optoelectronic components may be accurately placed over the apertures, thereby resulting in reliable physiological measurements.

Aspects of the disclosure are initially described in the context of systems supporting physiological data collection from users via wearable devices. Additional aspects of the disclosure are described in the context of perspective views of the inner shell, an assembly process, and perspective views of the wearable ring device.

FIG. 1 illustrates an example of a system 100 that supports ring-shaped housing alignment features and fabrication techniques in accordance with aspects of the present disclosure. The system 100 includes a plurality of electronic devices (e.g., wearable devices 104, user devices 106) that may be worn and/or operated by one or more users 102. The system 100 further includes a network 108 and one or more servers 110.

The electronic devices may include any electronic devices known in the art, including wearable devices 104 (e.g., ring wearable devices, watch wearable devices, etc.), user devices 106 (e.g., smartphones, laptops, tablets). The electronic devices associated with the respective users 102 may include one or more of the following functionalities: 1) measuring physiological data, 2) storing the measured data, 3) processing the data, 4) providing outputs (e.g., via GUIs) to a user 102 based on the processed data, and 5) communicating data with one another and/or other computing devices. Different electronic devices may perform one or more of the functionalities.

Example wearable devices 104 may include wearable computing devices, such as a ring computing device (hereinafter "ring") configured to be worn on a user's 102 finger, a wrist computing device (e.g., a smart watch, fitness band, or bracelet) configured to be worn on a user's 102 wrist, and/or a head mounted computing device (e.g., glasses/goggles). Wearable devices 104 may also include bands, straps (e.g., flexible or inflexible bands or straps), stick-on sensors, and the like, that may be positioned in other locations, such as bands around the head (e.g., a forehead headband), arm (e.g., a forearm band and/or bicep band), and/or leg (e.g., a thigh or calf band), behind the ear, under the armpit, and the like. Wearable devices 104 may also be attached to, or included in, articles of clothing. For example, wearable devices 104 may be included in pockets and/or pouches on clothing. As another example, wearable device 104 may be clipped and/or pinned to clothing, or may otherwise be maintained within the vicinity of the user 102. Example articles of clothing may include, but are not limited to, hats, shirts, gloves, pants, socks, outerwear (e.g., jackets), and undergarments. In some implementations, wearable devices 104 may be included with other types of devices such as training/sporting devices that are used during physical activity. For example, wearable devices 104 may be attached to, or included in, a bicycle, skis, a tennis racket, a golf club, and/or training weights.

Much of the present disclosure may be described in the context of a ring wearable device 104. Accordingly, the terms "ring 104," "wearable device 104," and like terms, may be used interchangeably, unless noted otherwise herein. However, the use of the term "ring 104" is not to be regarded as limiting, as it is contemplated herein that aspects of the present disclosure may be performed using other wearable devices (e.g., watch wearable devices, necklace wearable device, bracelet wearable devices, earring wearable devices, anklet wearable devices, and the like).

In some aspects, user devices 106 may include handheld mobile computing devices, such as smartphones and tablet computing devices. User devices 106 may also include personal computers, such as laptop and desktop computing devices. Other example user devices 106 may include server computing devices that may communicate with other electronic devices (e.g., via the Internet). In some implementations, computing devices may include medical devices, such as external wearable computing devices (e.g., Holter monitors). Medical devices may also include implantable medical devices, such as pacemakers and cardioverter defibrillators. Other example user devices 106 may include home computing devices, such as internet of things (IoT) devices (e.g., IoT devices), smart televisions, smart speakers, smart displays (e.g., video call displays), hubs (e.g., wireless communication hubs), security systems, smart appliances (e.g., thermostats and refrigerators), and fitness equipment.

Some electronic devices (e.g., wearable devices 104, user devices 106) may measure physiological parameters of respective users 102, such as photoplethysmography waveforms, continuous skin temperature, a pulse waveform, respiration rate, heart rate, heart rate variability (HRV), actigraphy, galvanic skin response, pulse oximetry, blood oxygen saturation (SpO2), blood sugar levels (e.g., glucose metrics), and/or other physiological parameters. Some electronic devices that measure physiological parameters may also perform some/all of the calculations described herein. Some electronic devices may not measure physiological parameters, but may perform some/all of the calculations described herein. For example, a ring (e.g., wearable device 104), mobile device application, or a server computing device May process received physiological data that was measured by other devices.

In some implementations, a user 102 may operate, or may be associated with, multiple electronic devices, some of which may measure physiological parameters and some of which may process the measured physiological parameters. In some implementations, a user 102 may have a ring (e.g., wearable device 104) that measures physiological parameters. The user 102 may also have, or be associated with, a user device 106 (e.g., mobile device, smartphone), where the wearable device 104 and the user device 106 are communicatively coupled to one another. In some cases, the user device 106 may receive data from the wearable device 104 and perform some/all of the calculations described herein. In some implementations, the user device 106 may also measure physiological parameters described herein, such as motion/activity parameters.

For example, as illustrated in FIG. 1, a first user 102-*a* (User 1) may operate, or may be associated with, a wearable device 104-*a* (e.g., ring 104-*a*) and a user device 106-*a* that may operate as described herein. In this example, the user device 106-*a* associated with user 102-*a* may process/store physiological parameters measured by the ring 104-*a*. Comparatively, a second user 102-*b* (User 2) may be associated with a ring 104-*b*, a watch wearable device 104-*c* (e.g., watch 104-*c*), and a user device 106-*b*, where the user device 106-*b* associated with user 102-*b* may process/store physiological parameters measured by the ring 104-*b* and/or the watch 104-*c*. Moreover, an nth user 102-*n* (User N) may be associated with an arrangement of electronic devices described herein (e.g., ring 104-*n*, user device 106-*n*). In some aspects, wearable devices 104 (e.g., rings 104, watches 104) and other electronic devices may be communicatively coupled to the user devices 106 of the respective users 102 via Bluetooth, Wi-Fi, and other wireless protocols.

In some implementations, the rings 104 (e.g., wearable devices 104) of the system 100 may be configured to collect physiological data from the respective users 102 based on arterial blood flow within the user's finger. In particular, a ring 104 may utilize one or more light emitting components, such as LEDs (e.g., red LEDs, green LEDs) that emit light on the palm-side of a user's finger to collect physiological data based on arterial blood flow within the user's finger. In general, the terms light emitting components, light emitting elements, and like terms, may include, but are not limited to, LEDs, micro LEDs, mini LEDs, laser diodes (LDs) (e.g., vertical cavity surface-emitting lasers (VCSELs), and the like.

In some cases, the system 100 may be configured to collect physiological data from the respective users 102 based on blood flow diffused into a microvascular bed of skin with capillaries and arterioles. For example, the system 100 may collect PPG data based on a measured amount of blood diffused into the microvascular system of capillaries and arterioles. In some implementations, the ring 104 may acquire the physiological data using a combination of both green and red LEDs. The physiological data may include any physiological data known in the art including, but not limited to, temperature data, accelerometer data (e.g., movement/motion data), heart rate data, HRV data, blood oxygen level data, or any combination thereof.

The use of both green and red LEDs may provide several advantages over other solutions, as red and green LEDs have been found to have their own distinct advantages when acquiring physiological data under different conditions (e.g., light/dark, active/inactive) and via different parts of the body, and the like. For example, green LEDs have been found to exhibit better performance during exercise. Moreover, using multiple LEDs (e.g., green and red LEDs) distributed around the ring 104 has been found to exhibit superior performance as compared to wearable devices that utilize LEDs that are positioned close to one another, such as within a watch wearable device. Furthermore, the blood vessels in the finger (e.g., arteries, capillaries) are more accessible via LEDs as compared to blood vessels in the wrist. In particular, arteries in the wrist are positioned on the bottom of the wrist (e.g., palm-side of the wrist), meaning only capillaries are accessible on the top of the wrist (e.g., back of hand side of the wrist), where wearable watch devices and similar devices are typically worn. As such, utilizing LEDs and other sensors within a ring 104 has been found to exhibit superior performance as compared to wearable devices worn on the wrist, as the ring 104 may have greater access to arteries (as compared to capillaries), thereby resulting in stronger signals and more valuable physiological data.

The electronic devices of the system 100 (e.g., user devices 106, wearable devices 104) may be communicatively coupled to one or more servers 110 via wired or wireless communication protocols. For example, as shown in FIG. 1, the electronic devices (e.g., user devices 106) may be communicatively coupled to one or more servers 110 via a network 108. The network 108 may implement transfer control protocol and internet protocol (TCP/IP), such as the Internet, or may implement other network 108 protocols. Network connections between the network 108 and the respective electronic devices may facilitate transport of data via email, web, text messages, mail, or any other appropriate form of interaction within a computer network 108. For example, in some implementations, the ring 104-a associated with the first user 102-a may be communicatively coupled to the user device 106-a, where the user device 106-a is communicatively coupled to the servers 110 via the network 108. In additional or alternative cases, wearable devices 104 (e.g., rings 104, watches 104) may be directly communicatively coupled to the network 108.

The system 100 may offer an on-demand database service between the user devices 106 and the one or more servers 110. In some cases, the servers 110 may receive data from the user devices 106 via the network 108, and may store and analyze the data. Similarly, the servers 110 may provide data to the user devices 106 via the network 108. In some cases, the servers 110 may be located at one or more data centers. The servers 110 may be used for data storage, management, and processing. In some implementations, the servers 110 may provide a web-based interface to the user device 106 via web browsers.

In some aspects, the system 100 may detect periods of time that a user 102 is asleep, and classify periods of time that the user 102 is asleep into one or more sleep stages (e.g., sleep stage classification). For example, as shown in FIG. 1, User 102-a may be associated with a wearable device 104-a (e.g., ring 104-a) and a user device 106-a. In this example, the ring 104-a may collect physiological data associated with the user 102-a, including temperature, heart rate, HRV, respiratory rate, and the like. In some aspects, data collected by the ring 104-a may be input to a machine learning classifier, where the machine learning classifier is configured to determine periods of time that the user 102-a is (or was) asleep. Moreover, the machine learning classifier may be configured to classify periods of time into different sleep stages, including an awake sleep stage, a rapid eye movement (REM) sleep stage, a light sleep stage (non-REM (NREM)), and a deep sleep stage (NREM). In some aspects, the classified sleep stages may be displayed to the user 102-a via a GUI of the user device 106-a. Sleep stage classification may be used to provide feedback to a user 102-a regarding the user's sleeping patterns, such as recommended bedtimes, recommended wake-up times, and the like. Moreover, in some implementations, sleep stage classification techniques described herein may be used to calculate scores for the respective user, such as Sleep Scores, Readiness Scores, and the like.

In some aspects, the system 100 may utilize circadian rhythm-derived features to further improve physiological data collection, data processing procedures, and other techniques described herein. The term circadian rhythm may refer to a natural, internal process that regulates an individual's sleep-wake cycle, that repeats approximately every 24 hours. In this regard, techniques described herein may utilize circadian rhythm adjustment models to improve physiological data collection, analysis, and data processing. For example, a circadian rhythm adjustment model may be input into a machine learning classifier along with physiological data collected from the user 102-a via the wearable device 104-a. In this example, the circadian rhythm adjustment model may be configured to "weight," or adjust, physiological data collected throughout a user's natural, approximately 24-hour circadian rhythm. In some implementations, the system may initially start with a "baseline" circadian rhythm adjustment model, and may modify the baseline model using physiological data collected from each user 102 to generate tailored, individualized circadian rhythm adjustment models that are specific to each respective user 102.

In some aspects, the system 100 may utilize other biological rhythms to further improve physiological data collection, analysis, and processing by phase of these other rhythms. For example, if a weekly rhythm is detected within an individual's baseline data, then the model may be configured to adjust "weights" of data by day of the week. Biological rhythms that may require adjustment to the model by this method include: 1) ultradian (faster than a day rhythms, including sleep cycles in a sleep state, and oscillations from less than an hour to several hours periodicity in the measured physiological variables during wake state; 2) circadian rhythms; 3) non-endogenous daily rhythms shown to be imposed on top of circadian rhythms, as in work schedules; 4) weekly rhythms, or other artificial time periodicities exogenously imposed (e.g., in a hypothetical culture with 12 day "weeks," 12 day rhythms could be used);

5) multi-day ovarian rhythms in women and spermatogenesis rhythms in men; 6) lunar rhythms (relevant for individuals living with low or no artificial lights); and 7) seasonal rhythms.

The biological rhythms are not always stationary rhythms. For example, many women experience variability in ovarian cycle length across cycles, and ultradian rhythms are not expected to occur at exactly the same time or periodicity across days even within a user. As such, signal processing techniques sufficient to quantify the frequency composition while preserving temporal resolution of these rhythms in physiological data may be used to improve detection of these rhythms, to assign phase of each rhythm to each moment in time measured, and to thereby modify adjustment models and comparisons of time intervals. The biological rhythm-adjustment models and parameters can be added in linear or non-linear combinations as appropriate to more accurately capture the dynamic physiological baselines of an individual or group of individuals.

In some aspects, the respective devices of the system 100 may support techniques for assembling and utilizing ring-shaped housing alignment features. The ring 104-a may include an inner shell that includes a plurality of apertures and defines an inner circumference of the ring 104-a. The inner shell may include a first set of alignment features including one or more planar regions that are formed into an arcuate ridge of the inner shell. The first set of alignment features may be an example of z-direction alignment features that align the PCB in the z-direction (e.g., the direction either closer to or farther from the center of the internal circumference of the ring 104-a). The inner shell may also include a second set of alignment features disposed within the inner shell of the ring-shaped housing. The second set of alignment features may be an example of x-direction and y-direction alignment features that align the PCB in the x-direction and y-direction, respectively. As described in more detail herein, the x-direction may refer to the direction along the circumference of the ring and the y-direction may refer to the direction perpendicular to the circumferential direction (e.g., in the width direction of the ring).

The ring 104-a may also include the PCB disposed within the ring-shaped housing. A portion of the PCB may contact the inner shell. The PCB may include the plurality of optoelectronic components including a set of light emitting components and a set of light-detecting components. In some cases, the PCB may include one or more rigid (e.g., non-flexible, non-bendable) regions that are formed into one or more portions of the PCB. The PCB may include other portions that are flexible or bendable such that these portions conform to a curved surface. The optoelectronic components may be positioned on the one or more rigid regions, and the one or more rigid regions of the PCB may be configured to engage with the first set of alignment features to align the plurality of optoelectronic components in the z-direction. In some cases, one or more features of the PCB are configured to engage with the second set of alignment features to align the plurality of optoelectronic components in one or both of the x-direction or the y-direction such that the plurality of optoelectronic components are aligned with the plurality of apertures in the inner shell or other housing component.

It should be appreciated by a person skilled in the art that one or more aspects of the disclosure may be implemented in a system 100 to additionally or alternatively solve other problems than those described above. Furthermore, aspects of the disclosure may provide technical improvements to "conventional" systems or processes as described herein. However, the description and appended drawings only include example technical improvements resulting from implementing aspects of the disclosure, and accordingly do not represent all of the technical improvements provided within the scope of the claims.

Figure 2:
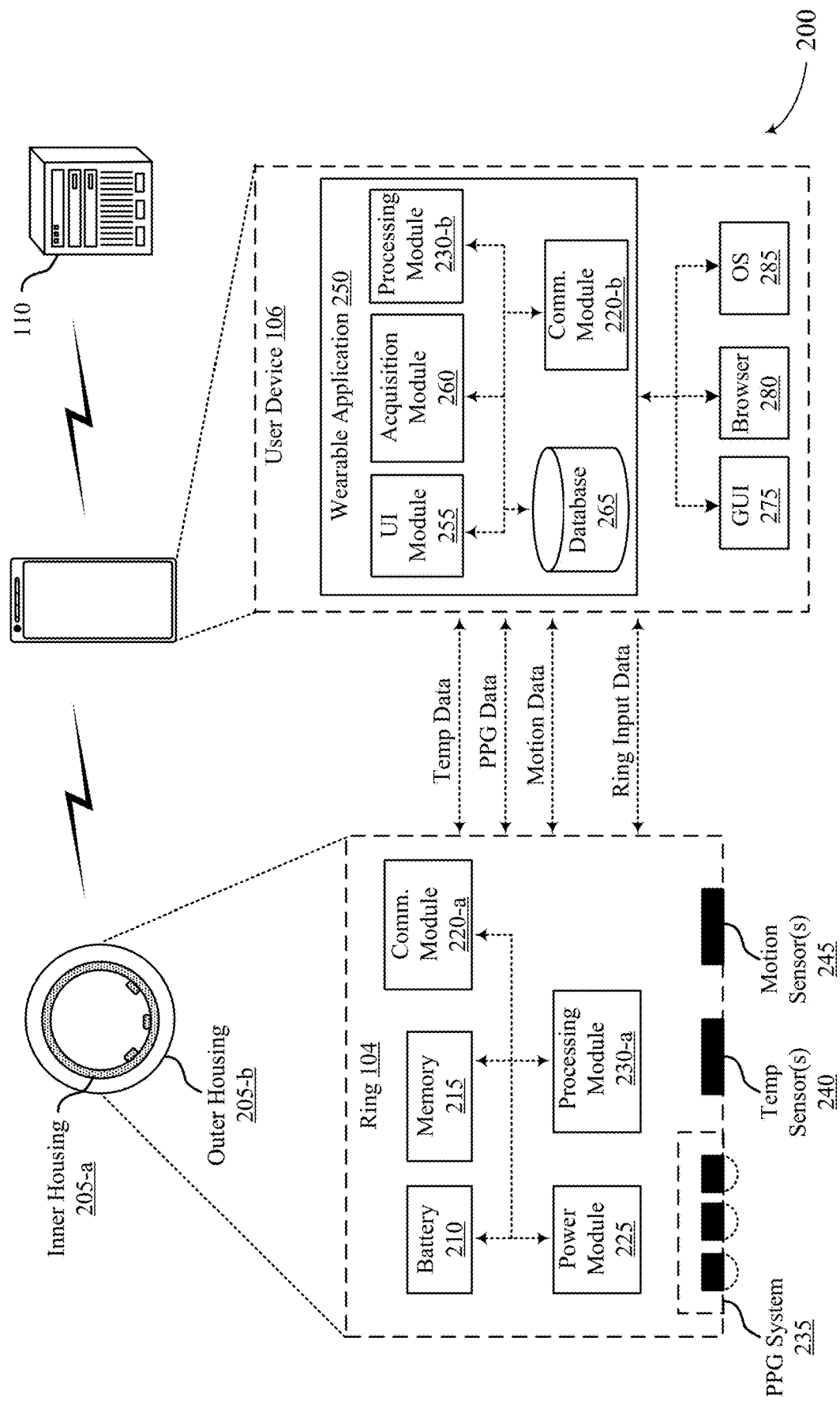
FIG. 2 illustrates an example of a system that supports ring-shaped housing alignment features and fabrication techniques in accordance with aspects of the present disclosure.

FIG. 2 illustrates an example of a system 200 that supports ring-shaped housing alignment features and fabrication techniques in accordance with aspects of the present disclosure. The system 200 may implement, or be implemented by, system 100. In particular, system 200 illustrates an example of a ring 104 (e.g., wearable device 104), a user device 106, and a server 110, as described with reference to FIG. 1.

In some aspects, the ring 104 may be configured to be worn around a user's finger, and may determine one or more user physiological parameters when worn around the user's finger. Example measurements and determinations may include, but are not limited to, user skin temperature, pulse waveforms, respiratory rate, heart rate, HRV, blood oxygen levels (SpO2), blood sugar levels (e.g., glucose metrics), and the like.

The system 200 further includes a user device 106 (e.g., a smartphone) in communication with the ring 104. For example, the ring 104 may be in wireless and/or wired communication with the user device 106. In some implementations, the ring 104 may send measured and processed data (e.g., temperature data, photoplethysmogram (PPG) data, motion/accelerometer data, ring input data, and the like) to the user device 106. The user device 106 may also send data to the ring 104, such as ring 104 firmware/configuration updates. The user device 106 may process data. In some implementations, the user device 106 may transmit data to the server 110 for processing and/or storage.

The ring 104 may include a housing 205 that may include an inner housing 205-a and an outer housing 205-b. In some aspects, the housing 205 of the ring 104 may store or otherwise include various components of the ring including, but not limited to, device electronics, a power source (e.g., battery 210, and/or capacitor), one or more substrates (e.g., printable circuit boards) that interconnect the device electronics and/or power source, and the like. The device electronics may include device modules (e.g., hardware/software), such as: a processing module 230-a, a memory 215, a communication module 220-a, a power module 225, and the like. The device electronics may also include one or more sensors. Example sensors may include one or more temperature sensors 240, a PPG sensor assembly (e.g., PPG system 235), and one or more motion sensors 245.

The sensors may include associated modules (not illustrated) configured to communicate with the respective components/modules of the ring 104, and generate signals associated with the respective sensors. In some aspects, each of the components/modules of the ring 104 may be communicatively coupled to one another via wired or wireless connections. Moreover, the ring 104 may include additional and/or alternative sensors or other components that are configured to collect physiological data from the user, including light sensors (e.g., LEDs), oximeters, and the like.

The ring 104 shown and described with reference to FIG. 2 is provided solely for illustrative purposes. As such, the ring 104 may include additional or alternative components as those illustrated in FIG. 2. Other rings 104 that provide functionality described herein may be fabricated. For example, rings 104 with fewer components (e.g., sensors) may be fabricated. In a specific example, a ring 104 with a single temperature sensor 240 (or other sensor), a power source, and device electronics configured to read the single temperature sensor 240 (or other sensor) may be fabricated.

In another specific example, a temperature sensor 240 (or other sensor) may be attached to a user's finger (e.g., using adhesives, wraps, clamps, spring loaded clamps, etc.). In this case, the sensor may be wired to another computing device, such as a wrist worn computing device that reads the temperature sensor 240 (or other sensor). In other examples, a ring 104 that includes additional sensors and processing functionality may be fabricated.

The housing 205 may include one or more housing 205 components. The housing 205 may include an outer housing 205-b component (e.g., a shell) and an inner housing 205-a component (e.g., a molding). The housing 205 may include additional components (e.g., additional layers) not explicitly illustrated in FIG. 2. For example, in some implementations, the ring 104 may include one or more insulating layers that electrically insulate the device electronics and other conductive materials (e.g., electrical traces) from the outer housing 205-b (e.g., a metal outer housing 205-b). The housing 205 may provide structural support for the device electronics, battery 210, substrate(s), and other components. For example, the housing 205 may protect the device electronics, battery 210, and substrate(s) from mechanical forces, such as pressure and impacts. The housing 205 may also protect the device electronics, battery 210, and substrate(s) from water and/or other chemicals.

The outer housing 205-b may be fabricated from one or more materials. In some implementations, the outer housing 205-b may include a metal, such as titanium, that may provide strength and abrasion resistance at a relatively light weight. The outer housing 205-b may also be fabricated from other materials, such polymers. In some implementations, the outer housing 205-b may be protective as well as decorative.

The inner housing 205-a may be configured to interface with the user's finger. The inner housing 205-a may be formed from a polymer (e.g., a medical grade polymer) or other material. In some implementations, the inner housing 205-a may be transparent. For example, the inner housing 205-a may be transparent to light emitted by the PPG light emitting diodes (LEDs). In some implementations, the inner housing 205-a component may be molded onto the outer housing 205-b. For example, the inner housing 205-a may include a polymer that is molded (e.g., injection molded) to fit into an outer housing 205-b metallic shell.

The ring 104 may include one or more substrates (not illustrated). The device electronics and battery 210 may be included on the one or more substrates. For example, the device electronics and battery 210 may be mounted on one or more substrates. Example substrates may include one or more printed circuit boards (PCBs), such as flexible PCB (e.g., polyimide). In some implementations, the electronics/battery 210 may include surface mounted devices (e.g., surface-mount technology (SMT) devices) on a flexible PCB. In some implementations, the one or more substrates (e.g., one or more flexible PCBs) may include electrical traces that provide electrical communication between device electronics. The electrical traces may also connect the battery 210 to the device electronics.

The device electronics, battery 210, and substrates may be arranged in the ring 104 in a variety of ways. In some implementations, one substrate that includes device electronics may be mounted along the bottom of the ring 104 (e.g., the bottom half), such that the sensors (e.g., PPG system 235, temperature sensors 240, motion sensors 245, and other sensors) interface with the underside of the user's finger. In these implementations, the battery 210 may be included along the top portion of the ring 104 (e.g., on another substrate).

The various components/modules of the ring 104 represent functionality (e.g., circuits and other components) that may be included in the ring 104. Modules may include any discrete and/or integrated electronic circuit components that implement analog and/or digital circuits capable of producing the functions attributed to the modules herein. For example, the modules may include analog circuits (e.g., amplification circuits, filtering circuits, analog/digital conversion circuits, and/or other signal conditioning circuits). The modules may also include digital circuits (e.g., combinational or sequential logic circuits, memory circuits etc.).

The memory 215 (memory module) of the ring 104 may include any volatile, non-volatile, magnetic, or electrical media, such as a random access memory (RAM), read-only memory (ROM), non-volatile RAM (NVRAM), electrically-erasable programmable ROM (EEPROM), flash memory, or any other memory device. The memory 215 may store any of the data described herein. For example, the memory 215 may be configured to store data (e.g., motion data, temperature data, PPG data) collected by the respective sensors and PPG system 235. Furthermore, memory 215 may include instructions that, when executed by one or more processing circuits, cause the modules to perform various functions attributed to the modules herein. The device electronics of the ring 104 described herein are only example device electronics. As such, the types of electronic components used to implement the device electronics may vary based on design considerations.

The functions attributed to the modules of the ring 104 described herein may be embodied as one or more processors, hardware, firmware, software, or any combination thereof. Depiction of different features as modules is intended to highlight different functional aspects and does not necessarily imply that such modules must be realized by separate hardware/software components. Rather, functionality associated with one or more modules may be performed by separate hardware/software components or integrated within common hardware/software components.

The processing module 230-a of the ring 104 may include one or more processors (e.g., processing units), microcontrollers, digital signal processors, systems on a chip (SOCs), and/or other processing devices. The processing module 230-a communicates with the modules included in the ring 104. For example, the processing module 230-a may transmit/receive data to/from the modules and other components of the ring 104, such as the sensors. As described herein, the modules may be implemented by various circuit components. Accordingly, the modules may also be referred to as circuits (e.g., a communication circuit and power circuit).

The processing module 230-a may communicate with the memory 215. The memory 215 may include computer-readable instructions that, when executed by the processing module 230-a, cause the processing module 230-a to perform the various functions attributed to the processing module 230-a herein. In some implementations, the processing module 230-a (e.g., a microcontroller) may include additional features associated with other modules, such as communication functionality provided by the communication module 220-a (e.g., an integrated Bluetooth Low Energy transceiver) and/or additional onboard memory 215.

The communication module 220-a may include circuits that provide wireless and/or wired communication with the user device 106 (e.g., communication module 220-b of the user device 106). In some implementations, the communication modules 220-*a*, 220-*b* may include wireless communication circuits, such as Bluetooth circuits and/or Wi-Fi circuits. In some implementations, the communication modules 220-*a*, 220-*b* can include wired communication circuits, such as Universal Serial Bus (USB) communication circuits. Using the communication module 220-*a*, the ring 104 and the user device 106 may be configured to communicate with each other. The processing module 230-*a* of the ring may be configured to transmit/receive data to/from the user device 106 via the communication module 220-*a*. Example data may include, but is not limited to, motion data, temperature data, pulse waveforms, heart rate data, HRV data, PPG data, and status updates (e.g., charging status, battery charge level, and/or ring 104 configuration settings). The processing module 230-*a* of the ring may also be configured to receive updates (e.g., software/firmware updates) and data from the user device 106.

The ring 104 may include a battery 210 (e.g., a rechargeable battery 210). An example battery 210 may include a Lithium-Ion or Lithium-Polymer type battery 210, although a variety of battery 210 options are possible. The battery 210 may be wirelessly charged. In some implementations, the ring 104 may include a power source other than the battery 210, such as a capacitor. The power source (e.g., battery 210 or capacitor) may have a curved geometry that matches the curve of the ring 104. In some aspects, a charger or other power source may include additional sensors that may be used to collect data in addition to, or that supplements, data collected by the ring 104 itself. Moreover, a charger or other power source for the ring 104 may function as a user device 106, in which case the charger or other power source for the ring 104 may be configured to receive data from the ring 104, store and/or process data received from the ring 104, and communicate data between the ring 104 and the servers 110.

In some aspects, the ring 104 includes a power module 225 that may control charging of the battery 210. For example, the power module 225 may interface with an external wireless charger that charges the battery 210 when interfaced with the ring 104. The charger may include a datum structure that mates with a ring 104 datum structure to create a specified orientation with the ring 104 during charging. The power module 225 may also regulate voltage(s) of the device electronics, regulate power output to the device electronics, and monitor the state of charge of the battery 210. In some implementations, the battery 210 may include a protection circuit module (PCM) that protects the battery 210 from high current discharge, over voltage during charging, and under voltage during discharge. The power module 225 may also include electro-static discharge (ESD) protection.

The one or more temperature sensors 240 may be electrically coupled to the processing module 230-*a*. The temperature sensor 240 may be configured to generate a temperature signal (e.g., temperature data) that indicates a temperature read or sensed by the temperature sensor 240. The processing module 230-*a* may determine a temperature of the user in the location of the temperature sensor 240. For example, in the ring 104, temperature data generated by the temperature sensor 240 may indicate a temperature of a user at the user's finger (e.g., skin temperature). In some implementations, the temperature sensor 240 may contact the user's skin. In other implementations, a portion of the housing 205 (e.g., the inner housing 205-*a*) may form a barrier (e.g., a thin, thermally conductive barrier) between the temperature sensor 240 and the user's skin. In some implementations, portions of the ring 104 configured to contact the user's finger may have thermally conductive portions and thermally insulative portions. The thermally conductive portions may conduct heat from the user's finger to the temperature sensors 240. The thermally insulative portions may insulate portions of the ring 104 (e.g., the temperature sensor 240) from ambient temperature.

In some implementations, the temperature sensor 240 may generate a digital signal (e.g., temperature data) that the processing module 230-*a* may use to determine the temperature. As another example, in cases where the temperature sensor 240 includes a passive sensor, the processing module 230-*a* (or a temperature sensor 240 module) may measure a current/voltage generated by the temperature sensor 240 and determine the temperature based on the measured current/voltage. Example temperature sensors 240 may include a thermistor, such as a negative temperature coefficient (NTC) thermistor, or other types of sensors including resistors, transistors, diodes, and/or other electrical/electronic components.

The processing module 230-*a* may sample the user's temperature over time. For example, the processing module 230-*a* may sample the user's temperature according to a sampling rate. An example sampling rate may include one sample per second, although the processing module 230-*a* may be configured to sample the temperature signal at other sampling rates that are higher or lower than one sample per second. In some implementations, the processing module 230-*a* may sample the user's temperature continuously throughout the day and night. Sampling at a sufficient rate (e.g., one sample per second) throughout the day may provide sufficient temperature data for analysis described herein.

The processing module 230-*a* may store the sampled temperature data in memory 215. In some implementations, the processing module 230-*a* may process the sampled temperature data. For example, the processing module 230-*a* may determine average temperature values over a period of time. In one example, the processing module 230-*a* may determine an average temperature value each minute by summing all temperature values collected over the minute and dividing by the number of samples over the minute. In a specific example where the temperature is sampled at one sample per second, the average temperature may be a sum of all sampled temperatures for one minute divided by sixty seconds. The memory 215 may store the average temperature values over time. In some implementations, the memory 215 may store average temperatures (e.g., one per minute) instead of sampled temperatures in order to conserve memory 215.

The sampling rate, which may be stored in memory 215, may be configurable. In some implementations, the sampling rate may be the same throughout the day and night. In other implementations, the sampling rate may be changed throughout the day/night. In some implementations, the ring 104 may filter/reject temperature readings, such as large spikes in temperature that are not indicative of physiological changes (e.g., a temperature spike from a hot shower). In some implementations, the ring 104 may filter/reject temperature readings that may not be reliable due to other factors, such as excessive motion during exercise (e.g., as indicated by a motion sensor 245).

The ring 104 (e.g., communication module) may transmit the sampled and/or average temperature data to the user device 106 for storage and/or further processing. The user device 106 may transfer the sampled and/or average temperature data to the server 110 for storage and/or further processing.

Although the ring 104 is illustrated as including a single temperature sensor 240, the ring 104 may include multiple temperature sensors 240 in one or more locations, such as arranged along the inner housing 205-a near the user's finger. In some implementations, the temperature sensors 240 may be stand-alone temperature sensors 240. Additionally, or alternatively, one or more temperature sensors 240 may be included with other components (e.g., packaged with other components), such as with the accelerometer and/or processor.

The processing module 230-a may acquire and process data from multiple temperature sensors 240 in a similar manner described with respect to a single temperature sensor 240. For example, the processing module 230 may individually sample, average, and store temperature data from each of the multiple temperature sensors 240. In other examples, the processing module 230-a may sample the sensors at different rates and average/store different values for the different sensors. In some implementations, the processing module 230-a may be configured to determine a single temperature based on the average of two or more temperatures determined by two or more temperature sensors 240 in different locations on the finger.

The temperature sensors 240 on the ring 104 may acquire distal temperatures at the user's finger (e.g., any finger). For example, one or more temperature sensors 240 on the ring 104 may acquire a user's temperature from the underside of a finger or at a different location on the finger. In some implementations, the ring 104 may continuously acquire distal temperature (e.g., at a sampling rate). Although distal temperature measured by a ring 104 at the finger is described herein, other devices may measure temperature at the same/different locations. In some cases, the distal temperature measured at a user's finger may differ from the temperature measured at a user's wrist or other external body location. Additionally, the distal temperature measured at a user's finger (e.g., a "shell" temperature) may differ from the user's core temperature. As such, the ring 104 may provide a useful temperature signal that may not be acquired at other internal/external locations of the body. In some cases, continuous temperature measurement at the finger may capture temperature fluctuations (e.g., small or large fluctuations) that may not be evident in core temperature. For example, continuous temperature measurement at the finger may capture minute-to-minute or hour-to-hour temperature fluctuations that provide additional insight that may not be provided by other temperature measurements elsewhere in the body.

The ring 104 may include a PPG system 235. The PPG system 235 may include one or more optical transmitters that transmit light. The PPG system 235 may also include one or more optical receivers that receive light transmitted by the one or more optical transmitters. An optical receiver may generate a signal (hereinafter "PPG" signal) that indicates an amount of light received by the optical receiver. The optical transmitters may illuminate a region of the user's finger. The PPG signal generated by the PPG system 235 may indicate the perfusion of blood in the illuminated region. For example, the PPG signal may indicate blood volume changes in the illuminated region caused by a user's pulse pressure. The processing module 230-a may sample the PPG signal and determine a user's pulse waveform based on the PPG signal. The processing module 230-a may determine a variety of physiological parameters based on the user's pulse waveform, such as a user's respiratory rate, heart rate, HRV, oxygen saturation, and other circulatory parameters.

In some implementations, the PPG system 235 may be configured as a reflective PPG system 235 where the optical receiver(s) receive transmitted light that is reflected through the region of the user's finger. In some implementations, the PPG system 235 may be configured as a transmissive PPG system 235 where the optical transmitter(s) and optical receiver(s) are arranged opposite to one another, such that light is transmitted directly through a portion of the user's finger to the optical receiver(s).

The number and ratio of transmitters and receivers included in the PPG system 235 may vary. Example optical transmitters may include LEDs. The optical transmitters may transmit light in the infrared spectrum and/or other spectrums. Example optical receivers may include, but are not limited to, photosensors, phototransistors, and photodiodes. The optical receivers may be configured to generate PPG signals in response to the wavelengths received from the optical transmitters. The location of the transmitters and receivers may vary. Additionally, a single device may include reflective and/or transmissive PPG systems 235.

The PPG system 235 illustrated in FIG. 2 may include a reflective PPG system 235 in some implementations. In these implementations, the PPG system 235 may include a centrally located optical receiver (e.g., at the bottom of the ring 104) and two optical transmitters located on each side of the optical receiver. In this implementation, the PPG system 235 (e.g., optical receiver) may generate the PPG signal based on light received from one or both of the optical transmitters. In other implementations, other placements, combinations, and/or configurations of one or more optical transmitters and/or optical receivers are contemplated.

The processing module 230-a may control one or both of the optical transmitters to transmit light while sampling the PPG signal generated by the optical receiver. In some implementations, the processing module 230-a may cause the optical transmitter with the stronger received signal to transmit light while sampling the PPG signal generated by the optical receiver. For example, the selected optical transmitter may continuously emit light while the PPG signal is sampled at a sampling rate (e.g., 250 Hz).

Sampling the PPG signal generated by the PPG system 235 may result in a pulse waveform that may be referred to as a "PPG." The pulse waveform may indicate blood pressure vs time for multiple cardiac cycles. The pulse waveform may include peaks that indicate cardiac cycles. Additionally, the pulse waveform may include respiratory induced variations that may be used to determine respiration rate. The processing module 230-a may store the pulse waveform in memory 215 in some implementations. The processing module 230-a may process the pulse waveform as it is generated and/or from memory 215 to determine user physiological parameters described herein.

The processing module 230-a may determine the user's heart rate based on the pulse waveform. For example, the processing module 230-a may determine heart rate (e.g., in beats per minute) based on the time between peaks in the pulse waveform. The time between peaks may be referred to as an interbeat interval (IBI). The processing module 230-a may store the determined heart rate values and IBI values in memory 215.

The processing module 230-a may determine HRV over time. For example, the processing module 230-a may determine HRV based on the variation in the IBIs. The processing module 230-a may store the HRV values over time in the memory 215. Moreover, the processing module 230-a may determine the user's respiratory rate over time. For example, the processing module 230-a may determine respiratory rate based on frequency modulation, amplitude modulation, or baseline modulation of the user's IBI values over a period of time. Respiratory rate may be calculated in breaths per minute or as another breathing rate (e.g., breaths per 30 seconds). The processing module 230-a may store user respiratory rate values over time in the memory 215.

The ring 104 may include one or more motion sensors 245, such as one or more accelerometers (e.g., 6-D accelerometers) and/or one or more gyroscopes (gyros). The motion sensors 245 may generate motion signals that indicate motion of the sensors. For example, the ring 104 may include one or more accelerometers that generate acceleration signals that indicate acceleration of the accelerometers. As another example, the ring 104 may include one or more gyro sensors that generate gyro signals that indicate angular motion (e.g., angular velocity) and/or changes in orientation. The motion sensors 245 may be included in one or more sensor packages. An example accelerometer/gyro sensor is a Bosch BMI160 inertial micro electro-mechanical system (MEMS) sensor that may measure angular rates and accelerations in three perpendicular axes.

The processing module 230-a may sample the motion signals at a sampling rate (e.g., 50 Hz) and determine the motion of the ring 104 based on the sampled motion signals. For example, the processing module 230-a may sample acceleration signals to determine acceleration of the ring 104. As another example, the processing module 230-a may sample a gyro signal to determine angular motion. In some implementations, the processing module 230-a may store motion data in memory 215. Motion data may include sampled motion data as well as motion data that is calculated based on the sampled motion signals (e.g., acceleration and angular values).

The ring 104 may store a variety of data described herein. For example, the ring 104 may store temperature data, such as raw sampled temperature data and calculated temperature data (e.g., average temperatures). As another example, the ring 104 may store PPG signal data, such as pulse waveforms and data calculated based on the pulse waveforms (e.g., heart rate values, IBI values, HRV values, and respiratory rate values). The ring 104 may also store motion data, such as sampled motion data that indicates linear and angular motion.

The ring 104, or other computing device, may calculate and store additional values based on the sampled/calculated physiological data. For example, the processing module 230 may calculate and store various metrics, such as sleep metrics (e.g., a Sleep Score), activity metrics, and readiness metrics. In some implementations, additional values/metrics may be referred to as "derived values." The ring 104, or other computing/wearable device, may calculate a variety of values/metrics with respect to motion. Example derived values for motion data may include, but are not limited to, motion count values, regularity values, intensity values, metabolic equivalence of task values (METs), and orientation values. Motion counts, regularity values, intensity values, and METs may indicate an amount of user motion (e.g., velocity/acceleration) over time. Orientation values may indicate how the ring 104 is oriented on the user's finger and if the ring 104 is worn on the left hand or right hand.

In some implementations, motion counts and regularity values may be determined by counting a number of acceleration peaks within one or more periods of time (e.g., one or more 30 second to 1 minute periods). Intensity values may indicate a number of movements and the associated intensity (e.g., acceleration values) of the movements. The intensity values may be categorized as low, medium, and high, depending on associated threshold acceleration values. METs may be determined based on the intensity of movements during a period of time (e.g., 30 seconds), the regularity/irregularity of the movements, and the number of movements associated with the different intensities.

In some implementations, the processing module 230-a may compress the data stored in memory 215. For example, the processing module 230-a may delete sampled data after making calculations based on the sampled data. As another example, the processing module 230-a may average data over longer periods of time in order to reduce the number of stored values. In a specific example, if average temperatures for a user over one minute are stored in memory 215, the processing module 230-a may calculate average temperatures over a five minute time period for storage, and then subsequently erase the one minute average temperature data. The processing module 230-a may compress data based on a variety of factors, such as the total amount of used/available memory 215 and/or an elapsed time since the ring 104 last transmitted the data to the user device 106.

Although a user's physiological parameters may be measured by sensors included on a ring 104, other devices may measure a user's physiological parameters. For example, although a user's temperature may be measured by a temperature sensor 240 included in a ring 104, other devices may measure a user's temperature. In some examples, other wearable devices (e.g., wrist devices) may include sensors that measure user physiological parameters. Additionally, medical devices, such as external medical devices (e.g., wearable medical devices) and/or implantable medical devices, may measure a user's physiological parameters. One or more sensors on any type of computing device may be used to implement the techniques described herein.

The physiological measurements may be taken continuously throughout the day and/or night. In some implementations, the physiological measurements may be taken during portions of the day and/or portions of the night. In some implementations, the physiological measurements may be taken in response to determining that the user is in a specific state, such as an active state, resting state, and/or a sleeping state. For example, the ring 104 can make physiological measurements in a resting/sleep state in order to acquire cleaner physiological signals. In one example, the ring 104 or other device/system may detect when a user is resting and/or sleeping and acquire physiological parameters (e.g., temperature) for that detected state. The devices/systems may use the resting/sleep physiological data and/or other data when the user is in other states in order to implement the techniques of the present disclosure.

In some implementations, as described previously herein, the ring 104 may be configured to collect, store, and/or process data, and may transfer any of the data described herein to the user device 106 for storage and/or processing. In some aspects, the user device 106 includes a wearable application 250, an operating system (OS), a web browser application (e.g., web browser 280), one or more additional applications, and a GUI 275. The user device 106 may further include other modules and components, including sensors, audio devices, haptic feedback devices, and the like. The wearable application 250 may include an example of an application (e.g., "app") that may be installed on the user device 106. The wearable application 250 may be configured to acquire data from the ring 104, store the acquired data, and process the acquired data as described herein. For example, the wearable application 250 may include a user interface (UI) module 255, an acquisition module 260, a processing module 230-*b*, a communication module 220-*b*, and a storage module (e.g., database 265) configured to store application data.

The various data processing operations described herein may be performed by the ring 104, the user device 106, the servers 110, or any combination thereof. For example, in some cases, data collected by the ring 104 may be pre-processed and transmitted to the user device 106. In this example, the user device 106 may perform some data processing operations on the received data, may transmit the data to the servers 110 for data processing, or both. For instance, in some cases, the user device 106 may perform processing operations that require relatively low processing power and/or operations that require a relatively low latency, whereas the user device 106 may transmit the data to the servers 110 for processing operations that require relatively high processing power and/or operations that may allow relatively higher latency.

In some aspects, the ring 104, user device 106, and server 110 of the system 200 may be configured to evaluate sleep patterns for a user. In particular, the respective components of the system 200 may be used to collect data from a user via the ring 104, and generate one or more scores (e.g., Sleep Score, Readiness Score) for the user based on the collected data. For example, as noted previously herein, the ring 104 of the system 200 may be worn by a user to collect data from the user, including temperature, heart rate, HRV, and the like. Data collected by the ring 104 may be used to determine when the user is asleep in order to evaluate the user's sleep for a given "sleep day." In some aspects, scores may be calculated for the user for each respective sleep day, such that a first sleep day is associated with a first set of scores, and a second sleep day is associated with a second set of scores. Scores may be calculated for each respective sleep day based on data collected by the ring 104 during the respective sleep day. Scores may include, but are not limited to, Sleep Scores, Readiness Scores, and the like.

In some cases, "sleep days" may align with the traditional calendar days, such that a given sleep day runs from midnight to midnight of the respective calendar day. In other cases, sleep days may be offset relative to calendar days. For example, sleep days may run from 6:00 pm (18:00) of a calendar day until 6:00 pm (18:00) of the subsequent calendar day. In this example, 6:00 pm may serve as a "cut-off time," where data collected from the user before 6:00 pm is counted for the current sleep day, and data collected from the user after 6:00 pm is counted for the subsequent sleep day. Due to the fact that most individuals sleep the most at night, offsetting sleep days relative to calendar days may enable the system 200 to evaluate sleep patterns for users in such a manner that is consistent with their sleep schedules. In some cases, users may be able to selectively adjust (e.g., via the GUI) a timing of sleep days relative to calendar days so that the sleep days are aligned with the duration of time that the respective users typically sleep.

In some implementations, each overall score for a user for each respective day (e.g., Sleep Score, Readiness Score) may be determined/calculated based on one or more "contributors," "factors," or "contributing factors." For example, a user's overall Sleep Score may be calculated based on a set of contributors, including: total sleep, efficiency, restfulness, REM sleep, deep sleep, latency, timing, or any combination thereof. The Sleep Score may include any quantity of contributors. The "total sleep" contributor may refer to the sum of all sleep periods of the sleep day. The "efficiency" contributor may reflect the percentage of time spent asleep compared to time spent awake while in bed, and may be calculated using the efficiency average of long sleep periods (e.g., primary sleep period) of the sleep day, weighted by a duration of each sleep period. The "restfulness" contributor may indicate how restful the user's sleep is, and may be calculated using the average of all sleep periods of the sleep day, weighted by a duration of each period. The restfulness contributor may be based on a "wake up count" (e.g., sum of all the wake-ups (when user wakes up) detected during different sleep periods), excessive movement, and a "got up count" (e.g., sum of all the got-ups (when user gets out of bed) detected during the different sleep periods).

The "REM sleep" contributor may refer to a sum total of REM sleep durations across all sleep periods of the sleep day including REM sleep. Similarly, the "deep sleep" contributor may refer to a sum total of deep sleep durations across all sleep periods of the sleep day including deep sleep. The "latency" contributor may signify how long (e.g., average, median, longest) the user takes to go to sleep, and may be calculated using the average of long sleep periods throughout the sleep day, weighted by a duration of each period and the number of such periods (e.g., consolidation of a given sleep stage or sleep stages may be its own contributor or weight other contributors). Lastly, the "timing" contributor may refer to a relative timing of sleep periods within the sleep day and/or calendar day, and may be calculated using the average of all sleep periods of the sleep day, weighted by a duration of each period.

By way of another example, a user's overall Readiness Score may be calculated based on a set of contributors, including: sleep, sleep balance, heart rate, HRV balance, recovery index, temperature, activity, activity balance, or any combination thereof. The Readiness Score may include any quantity of contributors. The "sleep" contributor may refer to the combined Sleep Score of all sleep periods within the sleep day. The "sleep balance" contributor may refer to a cumulative duration of all sleep periods within the sleep day. In particular, sleep balance may indicate to a user whether the sleep that the user has been getting over some duration of time (e.g., the past two weeks) is in balance with the user's needs. Typically, adults need 7-9 hours of sleep a night to stay healthy, alert, and to perform at their best both mentally and physically. However, it is normal to have an occasional night of bad sleep, so the sleep balance contributor takes into account long-term sleep patterns to determine whether each user's sleep needs are being met. The "resting heart rate" contributor may indicate a lowest heart rate from the longest sleep period of the sleep day (e.g., primary sleep period) and/or the lowest heart rate from naps occurring after the primary sleep period.

Continuing with reference to the "contributors" (e.g., factors, contributing factors) of the Readiness Score, the "HRV balance" contributor may indicate a highest HRV average from the primary sleep period and the naps happening after the primary sleep period. The HRV balance contributor may help users keep track of their recovery status by comparing their HRV trend over a first time period (e.g., two weeks) to an average HRV over some second, longer time period (e.g., three months). The "recovery index" contributor may be calculated based on the longest sleep period. Recovery index measures how long it takes for a user's resting heart rate to stabilize during the night. A sign of a very good recovery is that the user's resting heart rate stabilizes during the first half of the night, at least six hours before the user wakes up, leaving the body time to recover for the next day. The "body temperature" contributor may be calculated based on the longest sleep period (e.g., primary sleep period) or based on a nap happening after the longest sleep period if the user's highest temperature during the nap is at least 0.5° C. higher than the highest temperature during the longest period. In some aspects, the ring may measure a user's body temperature while the user is asleep, and the system 200 may display the user's average temperature relative to the user's baseline temperature. If a user's body temperature is outside of their normal range (e.g., clearly above or below 0.0), the body temperature contributor may be highlighted (e.g., go to a "Pay attention" state) or otherwise generate an alert for the user.

In some aspects, the system 200 may support techniques for assembling the ring 104 in accordance with the techniques described herein. In some cases, the ring 104 may include an inner shell that includes a plurality of apertures and defines an inner circumference of the ring 104. The inner shell may include a first set of alignment features including one or more planar regions that are formed into an arcuate ridge or other arcuate portion of the inner shell. The first set of alignment features may be an example of z-direction alignment features that align the PCB in the z-direction (e.g., the direction either closer to or farther from the center of the internal circumference of the ring 104-*a*). The inner shell may also include a second set of alignment features disposed within the inner shell of the ring-shaped housing that align the PCB within the inner shell in the x-direction and y-direction.

The PCB may include the plurality of optoelectronic components including a set of light emitting components and a set of light detecting components, and possibly other components or sensors, that are positioned on the PCB. In some cases, the PCB may include one or more rigid regions that are formed into one or more portions of the PCB. The optoelectronic components may be positioned on the one or more rigid regions, and the one or more rigid regions of the PCB may be configured to engage with the planar regions (e.g., z-direction alignment features) of the inner shell to align the plurality of optoelectronic components in the z-direction. In some cases, one or more features of the PCB are configured to engage with the second set of alignment features of the inner shell to align the plurality of optoelectronic components in the x-direction, the y-direction, or both such that the plurality of optoelectronic components are aligned with the plurality of apertures.

Figure 3:
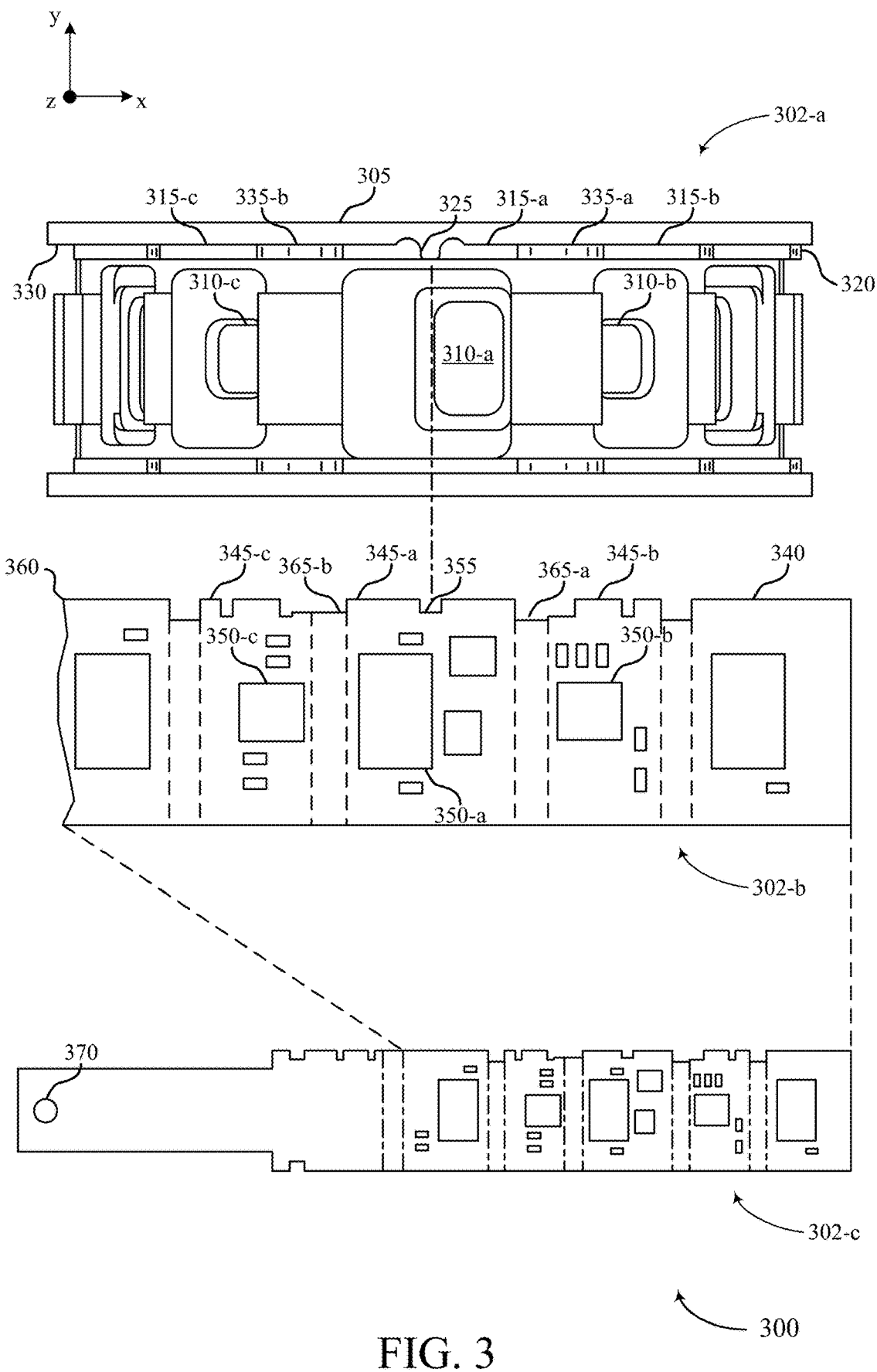
FIG. 3 shows an example of a system that supports ring-shaped housing alignment features and fabrication techniques in accordance with aspects of the present disclosure.

FIG. 3 shows an example of a system 300 that supports ring-shaped housing alignment features and fabrication techniques in accordance with aspects of the present disclosure. Aspects of the system 300 may implement, or be implemented by, aspects of the system 100, the system 200, or both. For example, the system 300 illustrated in FIG. 3 may include an example of the inner shell 305 and PCB 340 as described with reference to FIGS. 1 and 2.

The system 300 is illustrated via three separate views 302 in FIG. 3. The first view 302-*a* depicts a top-down (e.g., plan) view of the inner shell 305. The second view 302-*b* depicts a detailed top-down view of a portion of the PCB 340. Lastly, the third view 302-*c* depicts a top-down view of the entire PCB 340 (e.g., including the portion as shown in the second view 302-*b*).

The ring-shaped housing of the wearable ring device may include the inner shell 305. The inner shell 305 may be an example of the inner housing 205-*a* as described with reference to FIG. 2. The inner shell 305 may define an inner ring-shaped surface (e.g., inner circumferential surface) of the wearable ring device. The inner shell 305 may be made of a metal material (e.g., titanium), a plastic material, an epoxy material, a combination of materials, or any suitable material for manufacturing a wearable device.

The PCB 340 may include multiple electrical components. For example, the PCB 340 may include a plurality of optoelectronic components 350. The plurality of optoelectronic components 350 may include one or more light emitting components 350-*b* and 350-*c* (e.g., LEDs) and light detecting components 350-*a* (e.g., photodetectors (PDs)) disposed on a first surface of the PCB 340. The PCB 340 may further include one or more additional electrical components (e.g., accelerometers or other motion sensors) disposed on a second surface of the PCB 340 opposite the first surface, a first surface of the PCB 340, or both.

In some aspects, as shown in the first view 302-*a*, the inner surface of the inner shell 305 may include one or more apertures 310 that are configured to house the optoelectronic components 350 of the PCB 340. In some cases, the optoelectronic components 350 may extend into the apertures 310 such that a top surface of the optoelectronic components 350 are substantially flush with the inner ring-shaped surface of the inner shell 305. In other examples, the optoelectronic components 350 may extend into the apertures 310 such that they protrude into the inner circumference of the inner shell 305. Alternatively, the optoelectronic components 350 may be aligned with the apertures 310 but not fully extended into the apertures such that they are not yet flush with the inner ring-shaped surface. The different locations of the optoelectronic components 350 with respect to the inner surface of the inner shell 305 (e.g., protruded past the inner surface, flush with the inner surface, or offset back away from the inner surface) may be examples of adjusting the location of the optoelectronic components 350 along the z-direction. Such adjustments in the z-direction may have impacts on the measurement quality associated with the optoelectronic components, resulting in a need for reliability and precisely locating the optoelectronic components 350 along the z-direction with respect to the inner shell 305.

In some examples, by moving the optoelectronic components 350 up into the apertures 310 (instead of being recessed into the apertures 310), aspects of the present disclosure may enable the PCB 340 to be moved closer to (e.g., contact) the inner shell 305, thereby reducing the thickness and size of the wearable ring device. Further, moving all other electrical components (aside from components that need to be in contact with the user's tissue (such as the LEDs, PDs, temperature sensors, etc.) to the back-side of the PCB 340, enables the PCB 340 to be moved closer to the inner shell 305, thereby reducing the thickness of the wearable ring device.

As shown in the first view 302-*a*, the inner ring-shaped surface of the inner shell 305 may include one or more curved regions 335 and one or more planar regions 315. These curved regions 335 and planar regions 315 are shown in more detail in a perspective view in FIG. 4. The curved regions 335 may generally conform to a circumferential surface of an arcuate ridge 320 of the inner shell 305. The planar regions 315 may be formed by removing material from the arcuate ridge 320, thereby transitioning a curved surface into a planar surface. The one or more curved regions 335 are positioned between the one or more planar regions 315 such that the one or more planar regions 315 are alternating between the one or more curved regions 335 along the arcuate ridge 320 of the inner shell 305. In such cases, the curved regions 335 and the planar regions 315 may alternate around the circumference of the inner shell 305. For example, the curved region 335-*a* may be positioned between the planar region 315-*a* and planar region 315-*b*, and the curved region 335-*b* may be positioned between the planar region 315-*a* and planar region 315-*c*.

The planar regions 315 may be an example of a first set of alignment features of the inner shell 305. In some cases, the one or more apertures 310 (and therefore the optoelectronic components 350) may be positioned within or adjacent to the one or more planar regions 315. In such cases, the one or more apertures 310 may be aligned within the one or more planar regions 315. For example, the aperture 310-a may be positioned on planar region 315-a, the aperture 310-b may be positioned on planar region 315-b, and the aperture 310-c may be positioned on planar region 315-c.

As shown in the second view 302-b, the PCB 340 may include one or more flexible regions 365 and one or more rigid regions 345. The flexible regions 365 and one or more rigid regions 345 may be formed into one or more portions of the PCB 340. The one or more flexible regions 365 are positioned between the one or more rigid regions 345 such that the flexible regions 365 are alternating between the rigid regions 345 along the PCB 340. The plurality of optoelectronic components 350 are positioned on the one or more rigid regions 345. For example, the optoelectronic component 350-a may be positioned on rigid region 345-a, the optoelectronic component 350-b may be positioned on rigid region 345-b, and the optoelectronic component 350-c may be positioned on rigid region 345-c. The rigid regions 345 of the PCB 340 may be an example of a thicker section of the PCB 340 as compared to the flexible regions 365. The flexible regions 365 may be an example of strips of material between the rigid regions 345. For example, the flexible region 365-a may be positioned between the rigid region 345-a and rigid region 345-b, and the flexible region 365-b may be positioned between the rigid region 345-a and rigid region 345-c.

As described herein, the one or more rigid regions 345 of the PCB 340 are configured to engage with (e.g., seat or mate against) the first set of alignment features (e.g., the planar regions 315) to align the plurality of optoelectronic components 350 in a first direction (e.g., the z-direction). The first direction may be an example of the direction either closer to or farther from the center of the internal circumference of the wearable ring device.

The one or more flexible regions 365 of the PCB 340 may correspond to (e.g., be positioned on) the one or more curved regions 335 of the inner surface of the inner shell 305, and the one or more rigid regions 345 correspond to (e.g., are positioned on) the planar regions 315 of the inner surface of the inner shell 305. In such cases, the optoelectronic components 350 may be positioned on the rigid regions 345 of the PCB 340 such that the optoelectronic components 350 align with the apertures 310 disposed within the planar regions 315 of the inner ring-shaped surface of the inner shell 305. In some cases, the planar regions 315 of the inner shell 305 may enable the PCB 340 to be positioned against, or close to, the inner shell 305. That is, the inclusion of planar regions 315 in the inner shell 305 may enable the PCB 340 to be positioned closely against the inner shell 305, particularly around the optoelectronic components 350. As such, the inclusion of planar regions 315 may help to move the optoelectronic components 350 further into the apertures 310, thereby moving the PCB 340 closer to the inner shell 305 and reducing the thickness of the wearable ring device.

The one or more flexible regions 365 of the PCB 340 are configured to engage with the one or more curved regions 335 of the inner shell 305. In such cases, the PCB 340 also includes flexible regions 365 that lay flush against the curved regions 335 of the inner shell 305. The one or more rigid regions 345 of the PCB 340 are configured to engage with the first set of alignment features (e.g., the planar regions 315) to decrease a distance between the plurality of optoelectronic components 350 and the plurality of apertures 310 in the first direction. In such cases, the flat portions (e.g., planar regions 315) of the inner shell 305 may help move the PCB 340 closer to the inner shell 305.

By engaging the rigid regions 345 of the PCB with the planar regions 315 of the inner shell 305, the optoelectronic components 350 (disposed on the rigid regions 345) may extend into the apertures 310 (positioned within the planar regions 315) such that a top surface of the optoelectronic components 350 are substantially flush with the inner ring-shaped surface of the inner shell 305, thereby enabling the PCB 340 to be moved closer to (e.g., make contact with) the inner shell 305 and reduce the thickness and size of the wearable ring device.

To further align the PCB 340 in the inner shell 305, the inner shell 305 may include a second set of alignment features disposed within the inner shell 305 of the ring-shaped housing. The second set of alignment features may include at least a protruded element 325 and/or one or more circumferential edges 330. The second set of alignment features may align the PCB in the inner shell 305 in a second direction, a third direction, or both. The second direction may be an example of a x-direction, and the third direction may be an example of the y-direction.

The protruded element 325 may be positioned on or near the first set of alignment features (e.g., the planar region 315-a). The protruded element 325 may be configured to align the plurality of optoelectronic components 350 in the second direction may mating with a corresponding feature of the PCB 340 such that the x-location of the PCB is fixed with respect to the protruded element 325. For example, the protruded element 325 may be an example of an inlet x-direction locator that includes a notch to align the PCB 340 in the x-direction (e.g., in the left-right direction as viewed in view 302-a). Although protruded element 325 is shown as a notch that is aligned with aperture 310-a, it should be understood that the protruded element 325 may be placed in additional or alternative locations along the circumference of the inner shell 305. Alternatively, rather than protruding, the x-direction locator feature may be a slot or other inward-facing notch that mates with a protruding portion of the PCB 340.

The one or more circumferential edges 330 may serve as alignment features in the y-direction. The one or more circumferential edges 330 may be configured to align the plurality of optoelectronic components 350 in the third direction by mating with the edges of the PCB 340 such that the location of the PCB 340 in the y-direction is controlled by the distance between the circumferential edges 330 on opposite sides of the inner housing 305. For example, the circumferential edges 330 may be an example of inlet y-direction locator edges that are perpendicular with the z-direction location surfaces (e.g., planar regions 315) to align the PCB 340 in the y-direction.

For purposes of illustration, the arcuate ridge 320, the planar regions 315, the curved regions 335, and the circumferential edges 330 may be shown on a top portion of the inner shell 305. However, an arcuate ridge 320, planar regions 315, curved regions 335, and circumferential edges 330 may be additionally shown and illustrated on a bottom portion of the inner shell 305 opposite the top portion. In some cases, the protruded element 325 may be positioned on the bottom portion of the inner shell 305, the top portion, or both.

The PCB 340 may include one or more features that are configured to engage with the second set of alignment features (e.g., the circumferential edges 330 and/or the protruded element 325) to align the plurality of optoelectronic components 350 in one or both of the second direction or the third direction such that the plurality of optoelectronic components 350 are aligned with the plurality of apertures 310. For example, the one or more features of the PCB 340 may include a slot or cavity 355, edges 360, or both.

The cavity 355 may be positioned on a first rigid region 345-a of the one or more rigid regions 345. The cavity 355 may be configured to engage with the protruded element 325 to align the plurality of optoelectronic components 350 in the second direction such that the plurality of optoelectronic components 350 are aligned with the plurality of apertures 310. The cavity 355 may be an example of a PCB x-direction locator. In such cases, the cavity 355 may be an example of an indent that mates with the notch (e.g., the protruded element 325) to align the PCB 340 in the x-direction relative to the inner shell 305.

The one or more edges 360 of the PCB 340 may be configured to engage with the one or more circumferential edges 330 of the inner shell 305 to align the plurality of optoelectronic components 350 in the third direction such that the plurality of optoelectronic components 350 are aligned with the plurality of apertures 310. The edges 360 may be an example of PCB y-direction locator edges to align the PCB 340 in the y-direction.

As shown in the third view 302-c, the PCB 340 may include an attachment feature 370 that attaches the PCB 340 to a portion of the inner shell 305. The attachment feature 370 may be an example of a hook, a latch, a hole, or a combination thereof that is configured to adhere to a portion of the inner shell 305 to secure additionally secure the PCB 340 onto the inner shell 305 as the PCB 340 is wrapped around the inner shell 305, as further described with reference to FIG. 5.

Figure 4:
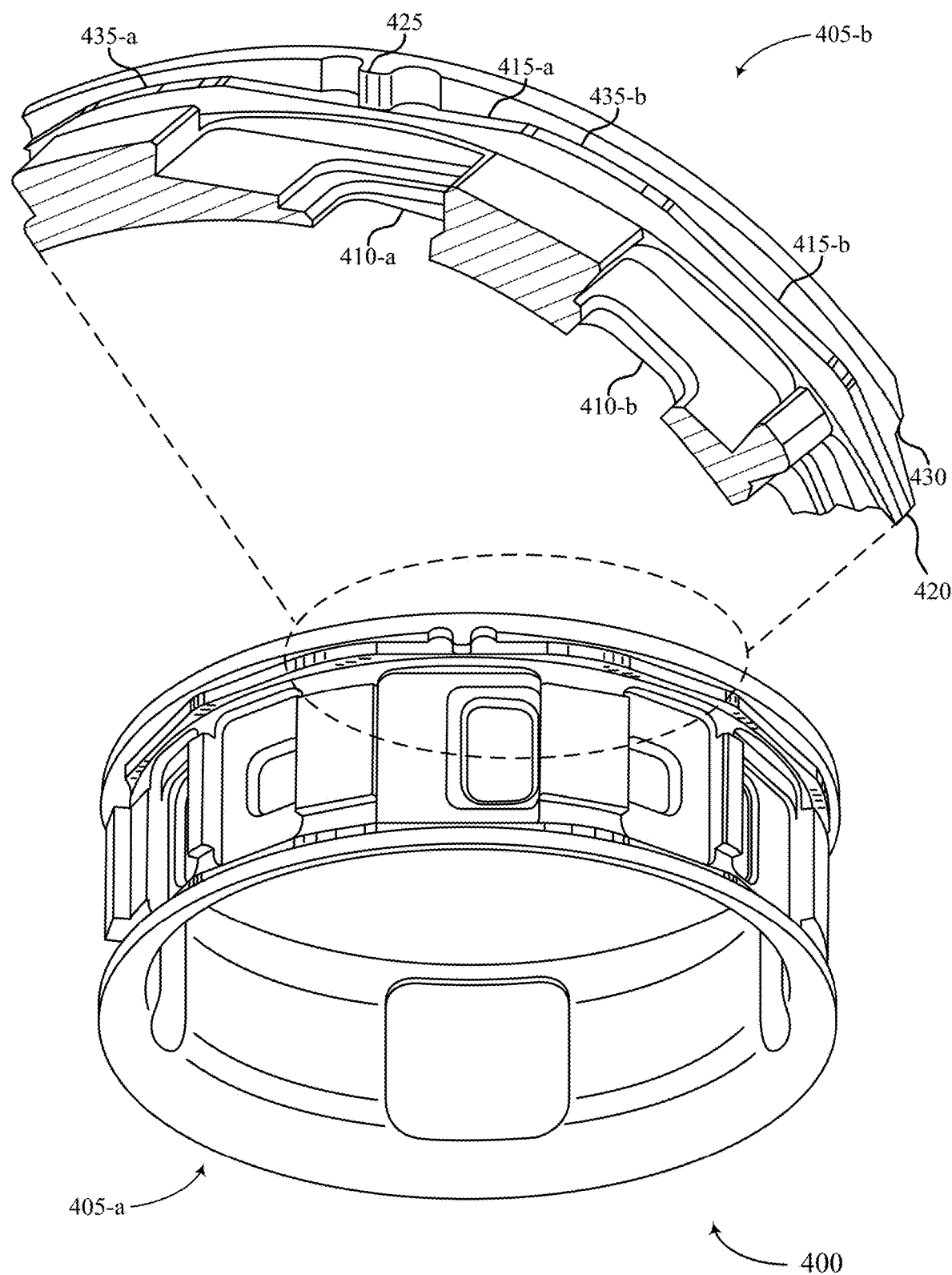
FIG. 4 shows an example of an inner shell that supports ring-shaped housing alignment features and fabrication techniques in accordance with aspects of the present disclosure.

FIG. 4 shows an example of an inner shell 400 that supports ring-shaped housing alignment features and fabrication techniques in accordance with aspects of the present disclosure. Aspects of the inner shell 400 may implement, or be implemented by, aspects of the system 100, the system 200, the system 300, or a combination thereof. For example, the inner shell 400 illustrated in FIG. 4 may include an example of the inner shell as described with reference to FIGS. 1-3. The inner shell 400 is illustrated via two separate views 405 in FIG. 4. The first view 405-a depicts a perspective view of the entire inner shell 400. The second view 405-b depicts a perspective cross-sectional view of a top portion of the inner shell 400.

The inner shell 400 may include alternating regions of planar regions 415 and curved regions 435. The planar regions 415 and the curved regions 435 may be formed into an arcuate ridge 420 of the inner shell 400. As shown in the second view 405-b, the arcuate ridge 420 may include at least a first curved region 435-a, a first planar region 415-a, a second curved region 435-b, and a second planar region 415-b. The alternating pattern between planar regions 415 and curved regions 435 may extend around an entire circumference of the inner shell 400.

The arcuate ridge 420 may extend around the entire circumference of the inner shell 400. The curved regions 435 may generally conform to the circumferential curvature of the arcuate ridge 420. To form the planar regions 415, a portion of the arcuate ridge 420 may be removed (e.g., ground down, shaved down, or some other removal machining technique) such that the planar regions 415 are formed from the originally manufactured curved regions 435. The planar regions 415 may be an example of a first set of alignment features of the inner shell 400 configured to align the PCB in the z-direction with respect to the inner surface of the wearable ring device.

The inner shell 400 may include one or more apertures 410. In some cases, the one or more apertures 410 may be positioned within or adjacent to the one or more planar regions 415. In such cases, the one or more apertures 410 may be aligned within the one or more planar regions 415. For example, the first aperture 410-a may be aligned with the first planar region 415-a, and the second aperture 410-b may be aligned with the second planar region 415-a.

The inner shell 400 may include a protruded element 425. The protruded element 425 may be positioned on at least one of the planar regions 415. For example, the protruded element 425 may be positioned on the first planar region 415-a. The protruded element 425 may be positioned equidistant between a first end of the first planar region 415-a and a second end opposite the first end of the first planar region 415-a. The protruded element 425 may include a variety of shapes and sizes, and is not limited to the example as shown in FIG. 4. For example, the protruded element 425 may be an example of a notch, a hook, a clip, a fastener, or any combination thereof. As described herein, the protruded element 425 may be configured to align the plurality of optoelectronic components in the second direction. The second direction may be an example of the x-direction along the arcuate ridge 420. The x-direction may run parallel to the circumference of the inner shell 400.

The inner shell 400 may include one or more circumferential edges 430. The one or more circumferential edges 430 may be positioned adjacent to the arcuate ridge 420. The one or more circumferential edges 430 may be configured to align the plurality of optoelectronic components in the third direction (e.g., the y-direction). For example, the circumferential edges 430 may be an example of inlet y-direction locator edges that are perpendicular with the z-direction location surfaces (e.g., planar regions 315) to align the PCB in the y-direction.

The circumferential edges 430 and the protruded element 425 may be an example of a second set of alignment features disposed within the inner shell 400. The second set of alignment features may align the PCB within the inner shell 400 in the second direction, the third direction, or both. In such cases, the planar regions 415, the circumferential edges 430, and the protruded element 425 may be configured to align the PCB within the inner shell in all directions to optimize (e.g., decrease) the distance between the optoelectronic components and the surface of the skin and optimize the position of the optoelectronic components within the apertures 410 such that a top surface of the optoelectronic components are substantially flush with the inner ring-shaped surface of the inner shell 400, thereby enabling the PCB to be moved closer to the inner shell 400 and reduce the thickness and size of the wearable ring device.

As shown in the second view 405-b, the inner shell 400 may include multiple levels, stepped configurations, and/or layers of material that make up the inner shell 400. For example, the apertures 410 may be included in a bottom level that is closest to the inner circumference of the inner shell 400. The protruded element 425 may be included in a top level that is farthest from the inner circumference of the inner shell 400. The arcuate ridge 420 (e.g., including the planar region 415 and the curved regions 435) may be included in a middle level closer to the top level of the inner shell 400.

Figure 5:
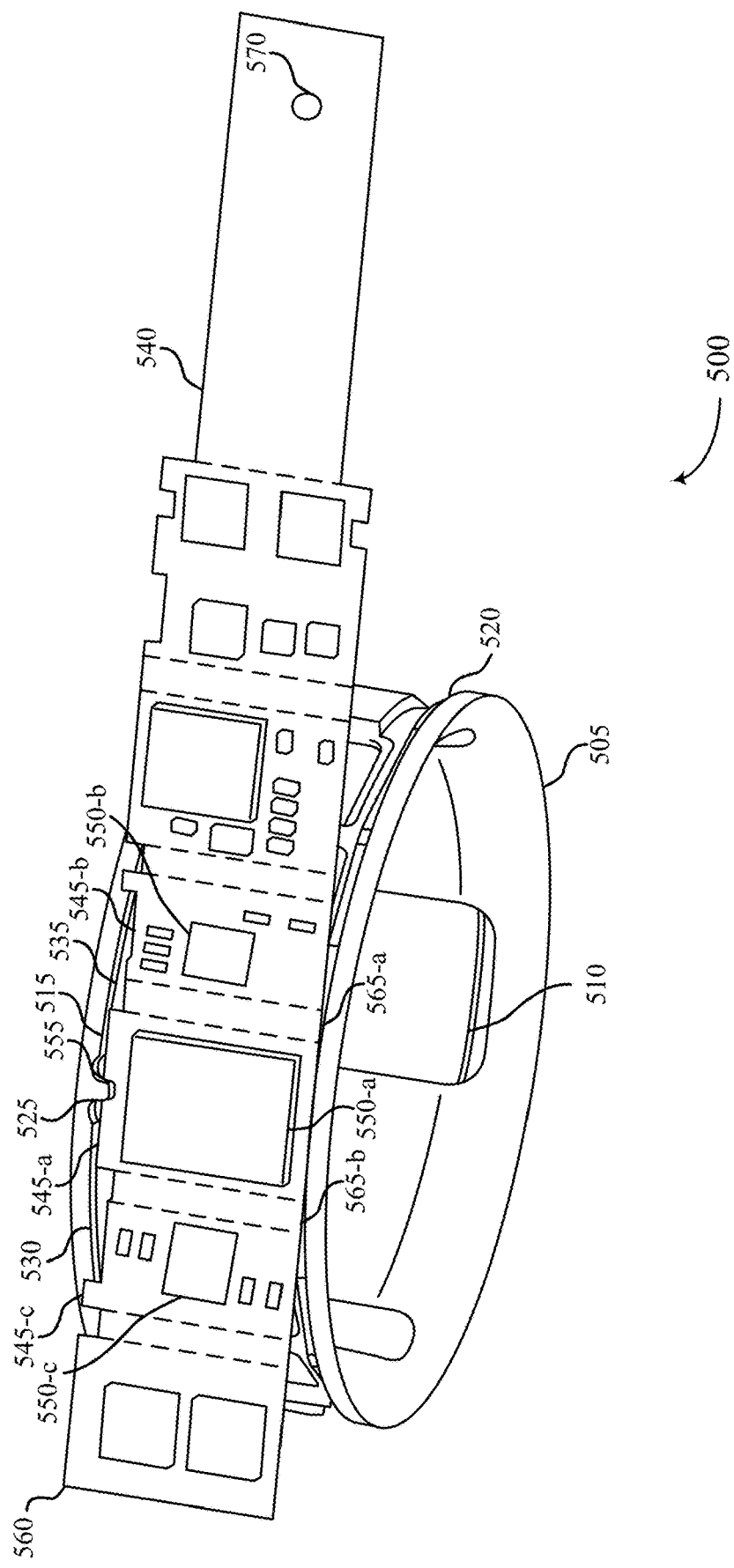
FIG. 5 shows an example of an assembly process that supports ring-shaped housing alignment features and fabrication techniques in accordance with aspects of the present disclosure.

FIG. 5 shows an example of an assembly process 500 that supports ring-shaped housing alignment features and fabrication techniques in accordance with aspects of the present disclosure. Aspects of the assembly process 500 may implement, or be implemented by, aspects of the system 100, the system 200, system 300, the inner shell 400, or any combination thereof. In particular, the assembly process 500 illustrated in FIG. 5 illustrates an example of positioning the PCB 540 onto the inner shell 505.

As shown in FIG. 5, and as described previously herein, the PCB 540 of the wearable ring device may include one or more LEDs and one or more PDs (e.g., the plurality of optoelectronic components 550) coupled to a first surface of the PCB 540. As described herein, coupling only the optoelectronic components 550 (and/or other components that are required to be in close proximity to the user's tissue, such as temperature sensors) to the rigid regions 545 of the PCB 540 may enable PCB 540 to be in close proximity to the inner shell 505 of the wearable ring device by allowing the optoelectronic components 550 to be disposed up within the apertures 510 of the inner shell 505. That is, the optoelectronic components 550 may be disposed within the apertures 510, thereby allowing the PCB 540 to be in contact with the inner shell 505. Comparatively, other electrical components that do not need to be in close proximity to the user's tissue, such as accelerometers, gyroscopes, etc., may be positioned on the second surface of the PCB 540 opposite of the first surface.

In some cases, one or more chambers (e.g., frames) may be formed around optoelectronic components 550 on the first surface of the PCB 540. For example, separate chambers may be formed around each respective LED and PD or a single chamber may be collectively formed around the LEDs and PDs. The chambers (e.g., frames) may effectively form "wells" where the optical lenses may be formed. In some cases, the chambers (frames) may be formed from a flexible material, such as a soft foam material or shock-absorbing material, to alleviate tolerances during the molding process for the optical lenses. In some examples, a surface of the plurality of chambers includes an adhesive that may be configured to secure the plurality of chambers to the inner shell 505 of the wearable ring device and the adhesive creates a water-tight seal around the plurality of apertures 510.

In some cases, the optical lenses (not illustrated) may be formed directly onto the surface of the PCB 540 without the use of the chamber(s). In some cases, the optical lenses may be formed onto the PCB 540 without any physical chamber or frame. The system may perform a molding process to mold a plurality of optical lenses over the optoelectronic components 550. In some cases, the plurality of optical lenses may include convex lenses (e.g., domes) that extend from the inner ring-shaped surface. In such cases, the optical lenses may be formed over the optoelectronic components 550.

The PCB 540 may be coupled to the inner shell 505 of the wearable ring device such that the optoelectronic components 550 (and therefore the optical lenses) are inserted into the one or more apertures 510 of the inner shell 505. The PCB 540 may include one or more alignment features that engage with alignment features within the inner shell 505 in order to ensure that the PCB 540 is oriented correctly within the inner shell 505. As noted previously herein, aligning the optoelectronic components 550 within the apertures 510 of the inner shell 505 may enable the optical properties of the LEDs, PDs, and/or wearable ring device to be customized and tailored, which may lead to improved physiological data collection.

In particular, the PCB 540 may be coupled to the inner shell 505 such that the top surface(s) of the optoelectronic components 550 are substantially flush with (or even extend past) the inner ring-shaped surface of the inner shell 505. As such, the optical lenses may extend past the inner-surface of the inner shell 505. Moreover, the optical lenses may be formed to substantially fill an entirety of the apertures 510. In some cases, the surface of the PCB 540 and/or a surface of the chambers may include an adhesive substance that binds to the inner shell 505 in order to form a water-tight seal around the apertures 510.

The inner ring-shaped surface of the inner shell 505 may include one or more curved regions 535 and one or more planar regions 515 positioned along the arcuate ridge 520. The plurality of apertures 510 may be disposed within the one or more planar regions 515. In some examples, the PCB 540 may be inserted into the ring-shaped housing (e.g., wrapped around the inner shell 505) such that a flexible portion 565 of the PCB 540 may be positioned within the wearable ring device proximate to the curved region 535 of the inner shell 505, and such that one or more rigid regions 545 of the PCB 540 may be positioned within the wearable ring device proximate to the one or more planar regions 515 of the inner shell 505. The optoelectronic components 550 may be disposed on the PCB 540 within the one or more rigid regions 545 such that the optoelectronic components 550 align with apertures 510 disposed within the planar regions 515 of the inner shell 505. The one or more alignment features disposed within the PCB 540 may be configured to engage with the one or more alignment features disposed within the inner shell 505 to align the plurality of optoelectronic components 550 within the plurality of apertures 510.

In such cases, when wrapping the PCB 540 around the inner shell 505, the rigid regions 545 of the PCB 540 may lay flat on (e.g., flush with) the planar regions 515 of the inner shell 505, and the flexible portions 565 of the PCB 540 may form to the curved regions 535 of the inner shell 505. The material of the PCB 540 may include a uniform thickness along the entire portion of the PCB 540. In such cases, the flexible portions 565 may be a same thickness as the rigid regions 545 of the PCB 540. In other examples, the rigid regions 545 may include a thickness greater than a thickness of the flexible portions 565.

The PCB 540 may include an attachment feature 570 that attaches the PCB 540 to a portion of the inner shell 505, as described with reference to FIG. 3. In some cases, the PCB 540 may include more than one cavity 555 positioned along the edge 560. In such cases, the inner shell 505 may include more than one protruded element 525 that corresponds to the more than one cavity 555. In some cases, the cavity 555 may be positioned on the rigid region 545 of the PCB 540 that includes the most accurate PD. Positioning the cavity 555 along a center portion of the edge 560 of the PCB 540 and the corresponding protruded element 525 along a center portion of the circumferential edge 530 may enable the PCB 540 to be placed in an optimum optical placement on the inner shell 505. In some cases, the cavity 555 may be positioned adjacent to a charging component of the PCB 540 to ensure optimal charging capacity and efficiency when the PCB 540 is wrapped around and placed on the inner shell 505.

The system may wrap the PCB 540 around the inner shell 505 such that the plurality of optical lenses extends through a plurality of apertures 510 within an inner ring-shaped surface of an inner shell 505 of the ring-shaped housing. In such cases, the optoelectronic components 550 may be substantially flush with the inner ring-shaped surface. The system may perform a molding process to secure the PCB 540 within the ring-shaped housing (e.g., onto the inner shell 505).

After inserting the PCB 540 with the optical lenses into the inner shell 505 (e.g., wrapping the PCB 540 around the inner shell 505), a molding or injection process may be performed to fill a cavity of the ring-shaped housing with the filler material. The filler material may be configured to at least partially fill the cavity and secure the PCB 540 to the inner shell 505, the outer shell, or both. Additionally, or alternatively, the PCB 540 may be secured to the inner shell 505, the outer shell, or both, through the use of mechanical locking features, side covers, gaskets, etc., and may therefore be secured within the ring without the use of another molding process. For example, the PCB 540 may be slid into a groove or other mechanical feature within the inner shell 505 to secure the PCB 540 within the inner shell 505.

Figure 6:
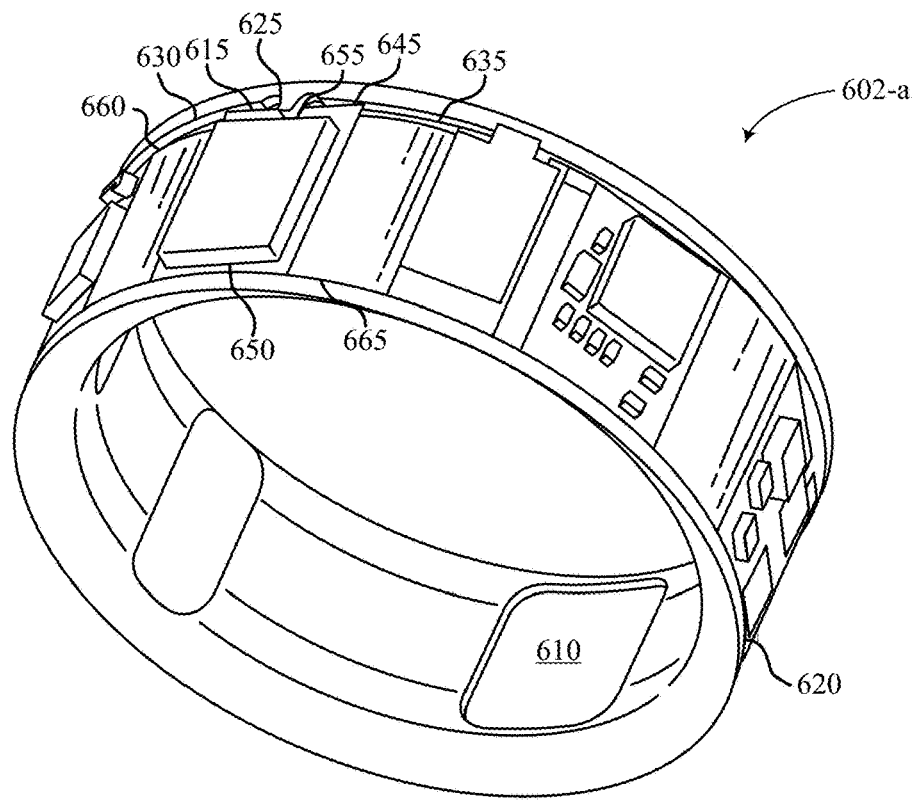
FIG. 6 shows an example of a wearable ring device that supports ring-shaped housing alignment features and fabrication techniques in accordance with aspects of the present disclosure.
Figure 6:
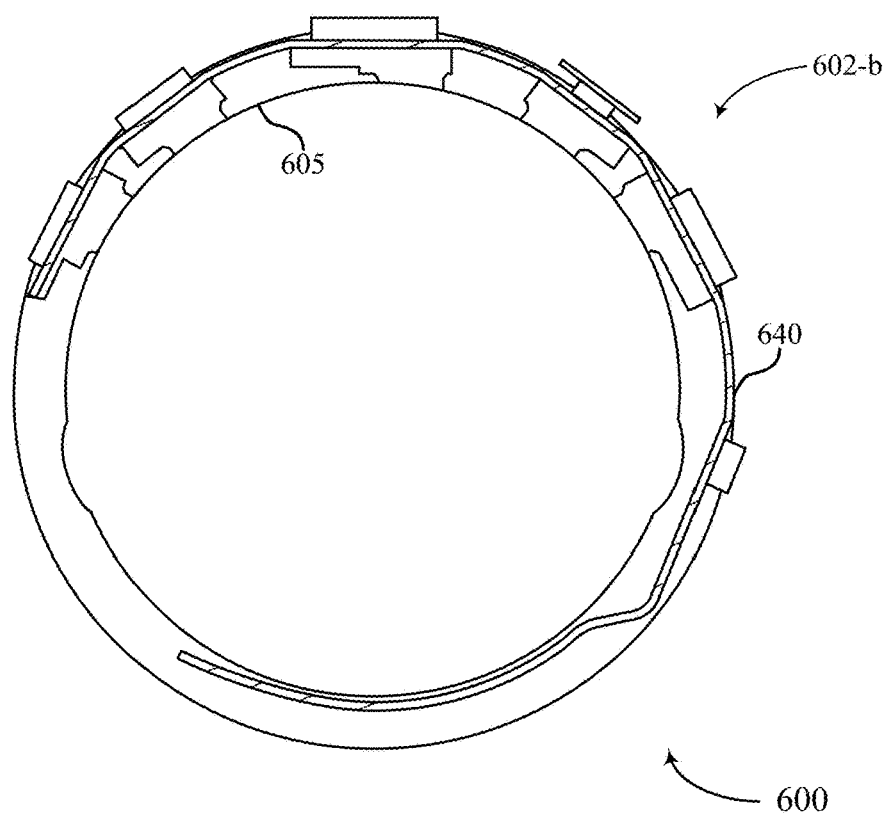

FIG. 6 shows an example of a wearable ring device 600 that supports ring-shaped housing alignment features and fabrication techniques in accordance with aspects of the present disclosure. Aspects of the wearable ring device 600 may implement, or be implemented by, aspects of the system 100, the system 200, the system 300, the inner shell 400, the assembly process 500, or a combination thereof. For example, the wearable ring device 600 illustrated in FIG. 6 may include an example of the inner shell 605 and PCB 640 as described with reference to FIGS. 1 through 5. The wearable ring device 600 is illustrated via two separate views 602 in FIG. 6. The first view 602-*a* depicts a perspective view of the wearable ring device 600. The second view 602-*b* depicts a cross-sectional view of the wearable ring device 600.

The wearable ring device 600 may include a ring-shaped housing that includes an inner shell 605 and an outer shell (not illustrated), which may be examples of the inner housing 205-*a* and the outer housing, respectively. The inner shell 605 may define an inner ring-shaped surface (e.g., inner circumferential surface) of the wearable ring device 600, and the outer shell may define an outer ring-shaped surface of the wearable ring device 600. The inner shell 605 and the outer shell may be made of the same or different materials, such as a metal material (e.g., titanium), a plastic material, an epoxy material, or any combination thereof. For purposes of illustration, the outer shell may not be illustrated in FIG. 6.

In some cases, a PCB 640 may be positioned within a cavity of the ring-shaped housing between the inner shell 605 and the outer shell. In some cases, a filler material may be injected into the ring-shaped housing to at least partially fill the cavity and secure the PCB 640 to the inner shell 605, the outer shell, or both. In such cases, the filler material may secure the outer shell to the inner shell 605. Additionally, or alternatively, the ring-shaped housing may include side covers (e.g., ring-shaped fittings) that are inserted into slots between the inner shell 605 and the outer shell, where the side covers (e.g., ring-shaped fittings) bind the inner shell 605 and the outer shell together.

In some aspects, the wearable ring device 600 may include one or more optical lenses that cover the optoelectronic components 650. The optical lenses may be positioned within (e.g., substantially fill) the one or more apertures 610 within the inner shell 605. The plurality of optoelectronic components 650 may be configured to extend through the plurality of apertures 610 when the plurality of optoelectronic components 650 are aligned with the plurality of apertures 610. In some cases, the optical lenses may include convex lenses that extend from the inner ring-shaped surface of the inner shell 605. The optical lenses may be formed using a surface mount technology (SMT) process or other molding process.

The optical lenses may be made of a (substantially) transparent material that enables light to pass through the one or more apertures 610. In some cases, each of the optical lenses may be formed or molded separately from one another. As such, the shape of each of the optical lenses may be the same or different from one another and may be customized based on whether the optical lens is formed over an LED or PD, based on the location of the optical lens within the inner shell 605, based on the size or shape of the respective aperture 610, or any combination thereof. In this regard, the optical lenses may be tailored to achieve certain optical and/or measurement properties of the wearable ring device 600.

In some aspects, the optical lenses may be formed over a plurality of optoelectronic components 650 before or after the PCB 640 is inserted into the inner shell 605. For example, the optical lenses may be molded onto the PCB 640, where the PCB 640 is then inserted into the inner shell 605 such that the molded/formed optical lenses are inserted into (and substantially fill) the one or more apertures 610 within the inner shell 605. Comparatively, the PCB 640 may be coupled to the inner shell 605 such that the plurality of optoelectronic components 650 are inserted into the one or more apertures 610 of the inner shell 305. Subsequently, a molding process may be used to form/mold the optical lenses into/over the apertures 610 and the plurality of optoelectronic components 650. In this example, the molding process may effectively fill the apertures 610 (and cover the plurality of optoelectronic components 650) with the material used to form the optical lenses. In some cases, the optical lenses may be disposed over the plurality of optoelectronic components 650 when the plurality of optoelectronic components 650 are aligned with the plurality of apertures 610.

In some cases, the PCB 640 may include an adhesive that helps couple the PCB 640 to the inner shell 605. As such, at least a portion of the PCB 640 may be in contact with the inner shell 605. In some cases, the PCB 640 may include a double-sided adhesive. For example, the PCB 640 may include an adhesive on a first side of the PCB 640 and on a second side of the PCB 640 opposite of the first side. In other examples, the PCB 640 may include an adhesive on a single side (e.g., the first side or the second side) such that the adhesive couples to the PCB 640 and then helps couple the PCB 640 to the inner shell 605. In some cases, the PCB 640 may include a light blocking layer between the LEDs and the PDs that helps prevent stray light from passing from the LEDs and the PDs within the cavity of the ring-shaped housing.

As described herein with reference to FIGS. 1 through 5, the inner shell 605 may include planar regions 615 (e.g., the first set of alignment features) and curved regions 635 that are formed on the arcuate ridge 620. The planar regions 615 may be configured to align the PCB 640 in the first direction. The inner shell 605 may also include a second set of alignment features that includes at least a protruded element 625 and circumferential edge 630 to align the PCB 640 in the second direction, the third direction, or both. The PCB 640 may include rigid regions 645 and flexible regions 665 as well as alignment features that include at least the cavity 655 and edges 660 to help align the PCB 640 within the inner shell 605.

It should be noted that the methods described above describe possible implementations, and that the operations and the steps may be rearranged or otherwise modified and that other implementations are possible. Furthermore, aspects from two or more of the methods may be combined.

An apparatus is described. The apparatus may include a ring-shaped housing comprising an inner shell, wherein the inner shell comprises a plurality of apertures and defines an inner circumference of the wearable ring device, the inner shell comprising, a first set of alignment features comprising one or more planar regions that are formed into an arcuate ridge of the inner shell, wherein the plurality of apertures are aligned within the one or more planar regions, a second set of alignment features disposed within the inner shell of the ring-shaped housing, a printed circuit board disposed within the ring-shaped housing, wherein at least a portion of the printed circuit board contacts the inner shell, the printed circuit board comprising, a plurality of optoelectronic components comprising a set of light emitting components and a set of light detecting components positioned on the printed circuit board, and one or more rigid regions that are formed into one or more portions of the printed circuit board, wherein the plurality of optoelectronic components are positioned on the one or more rigid regions, wherein the one or more rigid regions of the printed circuit board are configured to engage with the first set of alignment features to align the plurality of optoelectronic components in a first direction, and wherein one or more features of the printed circuit board are configured to engage with the second set of alignment features to align the plurality of optoelectronic components in one or both of a second direction or a third direction such that the plurality of optoelectronic components are aligned with the plurality of apertures.

In some examples of the apparatus, the second set of alignment features further comprises a protruded element positioned on the first set of alignment features, wherein the protruded element may be configured to align the plurality of optoelectronic components in the second direction.

In some examples of the apparatus, the one or more features of the printed circuit board comprises a cavity positioned on a first rigid region of the one or more rigid regions, wherein the cavity may be configured to engage with the protruded element to align the plurality of optoelectronic components in the second direction such that the plurality of optoelectronic components may be aligned with the plurality of apertures.

In some examples of the apparatus, the second set of alignment features further comprises one or more circumferential edges that may be positioned adjacent to the first set of alignment features, wherein the one or more circumferential edges may be configured to align the plurality of optoelectronic components in the third direction.

In some examples of the apparatus, the one or more features of the printed circuit board further comprises one or more edges that may be positioned adjacent to the one or more rigid regions, wherein the one or more edges may be configured to engage with the one or more circumferential edges to align the plurality of optoelectronic components in the third direction such that the plurality of optoelectronic components may be aligned with the plurality of apertures.

In some examples of the apparatus, the inner shell further comprises one or more curved regions that may be formed into the arcuate ridge of the inner shell, wherein the one or more curved regions may be positioned between the first set of alignment features such that the one or more planar regions may be alternating between the one or more curved regions along the arcuate ridge of the inner shell.

In some examples of the apparatus, the printed circuit board further comprises one or more flexible regions that may be formed into the one or more portions of the printed circuit board, wherein the one or more flexible regions of the printed circuit board may be configured to engage with the one or more curved regions of the inner shell, and wherein the one or more flexible regions may be positioned between the one or more rigid regions such that the one or more flexible regions may be alternating between the one or more rigid regions of the printed circuit board.

In some examples of the apparatus, the one or more rigid regions of the printed circuit board may be configured to engage with the first set of alignment features to decrease a distance between the plurality of optoelectronic components and the plurality of apertures in the first direction.

In some examples of the apparatus, the plurality of optoelectronic components may be configured to extend through the plurality of apertures when the plurality of optoelectronic components may be aligned with the plurality of apertures.

In some examples of the apparatus, the ring-shaped housing further comprises a plurality of optical lenses disposed over the plurality of optoelectronic components when the plurality of optoelectronic components may be aligned with the plurality of apertures.

In some examples of the apparatus, the ring-shaped housing further comprises an outer shell and the outer shell defines an outer ring-shaped surface of the wearable ring device.

An apparatus is described. The apparatus may include an inner shell, wherein the inner shell comprises a plurality of apertures and defines an inner circumference of the wearable ring device, the inner shell comprising a first set of alignment features comprising one or more planar regions that are formed into an arcuate ridge of the inner shell, wherein the plurality of apertures are aligned within the one or more planar regions and a second set of alignment features disposed within the inner shell of the ring-shaped housing component, wherein a portion of a printed circuit board are configured to engage with the first set of alignment features to align a plurality of optoelectronic components in a first direction, and wherein one or more features of the printed circuit board are configured to engage with the second set of alignment features to align the plurality of optoelectronic components in one or both of a second direction or a third direction such that the plurality of optoelectronic components are aligned with the plurality of apertures.

In some examples of the apparatus, the second set of alignment features further comprise a protruded element positioned on the first set of alignment features, wherein the protruded element is configured to align the plurality of optoelectronic components in the second direction.

In some examples of the apparatus, the second set of alignment features further comprise one or more circumferential edges that are positioned adjacent to the first set of alignment features, wherein the one or more circumferential edges are configured to align the plurality of optoelectronic components in the third direction.

In some examples of the apparatus, the inner shells further comprises one or more curved regions that are formed into the arcuate ridge of the inner shell, wherein the one or more curved regions are positioned between the first set of alignment features such that the one or more planar regions are alternating between the one or more curved regions along the arcuate ridge of the inner shell.

In some examples of the apparatus, the plurality of optoelectronic components are configured to extend through the plurality of apertures when the plurality of optoelectronic components are aligned with the plurality of apertures.

In some examples of the apparatus, the apparatus further comprises a plurality of optical lenses disposed over the plurality of optoelectronic components when the plurality of optoelectronic components are aligned with the plurality of aperture.

In some examples of the apparatus, the apparatus further comprises an outer shell defining an outer ring-shaped surface of the wearable ring device.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable ROM (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A wearable ring device, comprising:
    a ring-shaped housing comprising an inner shell, wherein the inner shell comprises a plurality of apertures and defines an inner circumference of the wearable ring device, the inner shell comprising:
        a first set of alignment features comprising one or more planar regions that are formed into an arcuate ridge of the inner shell, wherein the plurality of apertures are aligned within the one or more planar regions; and
        a second set of alignment features disposed within the inner shell of the ring-shaped housing; and a printed circuit board disposed within the ring-shaped housing, wherein at least a portion of the printed circuit board contacts the inner shell, the printed circuit board comprising:
  a plurality of optoelectronic components comprising a set of light emitting components and a set of light detecting components positioned on the printed circuit board; and
  one or more rigid regions that are formed into one or more portions of the printed circuit board, wherein the plurality of optoelectronic components are positioned on the one or more rigid regions, wherein the one or more rigid regions of the printed circuit board are configured to engage with the first set of alignment features to align the plurality of optoelectronic components in a first direction, and wherein one or more features of the printed circuit board are configured to engage with the second set of alignment features to align the plurality of optoelectronic components in one or both of a second direction or a third direction such that the plurality of optoelectronic components are aligned with the plurality of apertures.

2. The wearable ring device of claim 1, wherein the second set of alignment features further comprises:
  a protruded element positioned on the first set of alignment features, wherein the protruded element is configured to align the plurality of optoelectronic components in the second direction.

3. The wearable ring device of claim 2, wherein the one or more features of the printed circuit board comprises:
  a cavity positioned on a first rigid region of the one or more rigid regions, wherein the cavity is configured to engage with the protruded element to align the plurality of optoelectronic components in the second direction such that the plurality of optoelectronic components are aligned with the plurality of apertures.

4. The wearable ring device of claim 1, wherein the second set of alignment features further comprises:
  one or more circumferential edges that are positioned adjacent to the first set of alignment features, wherein the one or more circumferential edges are configured to align the plurality of optoelectronic components in the third direction.

5. The wearable ring device of claim 4, wherein the one or more features of the printed circuit board further comprises:
  one or more edges that are positioned adjacent to the one or more rigid regions, wherein the one or more edges are configured to engage with the one or more circumferential edges to align the plurality of optoelectronic components in the third direction such that the plurality of optoelectronic components are aligned with the plurality of apertures.

6. The wearable ring device of claim 1, wherein the inner shell further comprises:
  one or more curved regions that are formed into the arcuate ridge of the inner shell, wherein the one or more curved regions are positioned between the first set of alignment features such that the one or more planar regions are alternating between the one or more curved regions along the arcuate ridge of the inner shell.

7. The wearable ring device of claim 6, wherein the printed circuit board further comprises:
  one or more flexible regions that are formed into the one or more portions of the printed circuit board, wherein the one or more flexible regions of the printed circuit board are configured to engage with the one or more curved regions of the inner shell, and wherein the one or more flexible regions are positioned between the one or more rigid regions such that the one or more flexible regions are alternating between the one or more rigid regions of the printed circuit board.

8. The wearable ring device of claim 1, wherein the one or more rigid regions of the printed circuit board are configured to engage with the first set of alignment features to decrease a distance between the plurality of optoelectronic components and the plurality of apertures in the first direction.

9. The wearable ring device of claim 1, wherein the plurality of optoelectronic components are configured to extend through the plurality of apertures when the plurality of optoelectronic components are aligned with the plurality of apertures.

10. The wearable ring device of claim 1, wherein the ring-shaped housing further comprises a plurality of optical lenses disposed over the plurality of optoelectronic components when the plurality of optoelectronic components are aligned with the plurality of apertures.

11. The wearable ring device of claim 1, wherein:
  the ring-shaped housing further comprises an outer shell; and
  the outer shell defines an outer ring-shaped surface of the wearable ring device.

12. A ring-shaped housing component of a wearable ring device, comprising:
  an inner shell, wherein the inner shell comprises a plurality of apertures and defines an inner circumference of the wearable ring device, the inner shell comprising:
    a first set of alignment features comprising one or more planar regions that are formed into an arcuate ridge of the inner shell, wherein the plurality of apertures are aligned within the one or more planar regions; and
    a second set of alignment features disposed within the inner shell of the ring-shaped housing component, wherein a portion of a printed circuit board is configured to engage with the first set of alignment features to align a plurality of optoelectronic components in a first direction, and wherein one or more features of the printed circuit board are configured to engage with the second set of alignment features to align the plurality of optoelectronic components in one or both of a second direction or a third direction such that the plurality of optoelectronic components are aligned with the plurality of apertures.

13. The ring-shaped housing component of claim 12, wherein the second set of alignment features further comprises:
  a protruded element positioned on the first set of alignment features, wherein the protruded element is configured to align the plurality of optoelectronic components in the second direction.

14. The ring-shaped housing component of claim 12, wherein the second set of alignment features further comprises:
  one or more circumferential edges that are positioned adjacent to the first set of alignment features, wherein the one or more circumferential edges are configured to align the plurality of optoelectronic components in the third direction.

15. The ring-shaped housing component of claim 12, wherein the inner shell further comprises:

one or more curved regions that are formed into the arcuate ridge of the inner shell, wherein the one or more curved regions are positioned between the first set of alignment features such that the one or more planar regions are alternating between the one or more curved regions along the arcuate ridge of the inner shell.

16. The ring-shaped housing component of claim 12, wherein the plurality of optoelectronic components are configured to extend through the plurality of apertures when the plurality of optoelectronic components are aligned with the plurality of apertures.

17. The ring-shaped housing component of claim 12, further comprising:
    a plurality of optical lenses disposed over the plurality of optoelectronic components when the plurality of optoelectronic components are aligned with the plurality of apertures.

18. The ring-shaped housing component of claim 12, further comprising:
    an outer shell defining an outer ring-shaped surface of the wearable ring device.

* * * * *